(12) United States Patent
Sorrells

(10) Patent No.: US 7,181,199 B2
(45) Date of Patent: Feb. 20, 2007

(54) REAL-TIME WIRELESS EXCHANGE OF OBJECTS

(75) Inventor: David F. Sorrells, Middleburg, FL (US)

(73) Assignee: Parkervision, Inc., Jacksonville, FL (US)

(*) Notice: Subject to any disclaimer, the term of this patent is extended or adjusted under 35 U.S.C. 154(b) by 287 days.

(21) Appl. No.: 10/783,098

(22) Filed: Feb. 23, 2004

(65) Prior Publication Data

US 2004/0219894 A1   Nov. 4, 2004

Related U.S. Application Data

(60) Provisional application No. 60/466,419, filed on Apr. 30, 2003.

(51) Int. Cl.
*H04Q 7/20* (2006.01)

(52) U.S. Cl. .................. 455/414.1; 455/3.01; 455/313; 455/131

(58) Field of Classification Search ............ 455/414.1, 455/414.3, 3.01, 3.06, 418
See application file for complete search history.

(56) References Cited

U.S. PATENT DOCUMENTS

| | | | |
|---|---|---|---|
| 6,049,706 A | 4/2000 | Cook et al. | |
| 6,061,551 A | 5/2000 | Sorrells et al. | |
| 6,061,555 A | 5/2000 | Bultman et al. | |
| 6,091,940 A | 7/2000 | Sorrells et al. | |
| 6,370,371 B1 | 4/2002 | Sorrells et al. | |
| 6,615,186 B1* | 9/2003 | Kolls | 705/26 |
| 6,973,476 B1* | 12/2005 | Naden et al. | 709/203 |
| 2002/0023028 A1* | 2/2002 | Quarendon et al. | 705/26 |
| 2003/0053433 A1* | 3/2003 | Chun | 370/338 |
| 2004/0117851 A1* | 6/2004 | Karaoguz et al. | 725/134 |

OTHER PUBLICATIONS

U.S. Appl. No. 09/525,615, filed Mar. 2000, Sorrells et al.
U.S. Appl. No. 09/526,041, filed Mar. 2000, Sorrells et al.
U.S. Appl. No. 09/550,644, filed Apr. 2000, Sorrells et al.

* cited by examiner

*Primary Examiner*—Erik A. Gary
(74) *Attorney, Agent, or Firm*—Sterne Kessler Goldstein & Fox PLLC

(57) ABSTRACT

A system, method, and computer program product for automatically exchanging objects in a wireless mobile environment. The invention operates by transmitting a request for objects to a source, receiving at least some of the requested objects from the source, and processing the received objects. The invention uses a frequency down-conversion module that comprises a switch, a capacitor coupled to the switch, and a pulse generator coupled to the switch. The pulse generator outputs pulses to the switch, where the pulses have apertures and cause the switch to close and sub-sample a carrier signal over the apertures. Energy is transferred from the carrier signal and stored using the capacitor during the apertures of the pulses, and a lower frequency signal is generated from the transferred energy. The invention also uses a frequency up-conversion module that comprises an energy transfer signal generator, a switch module controlled by the energy transfer signal generator, and a storage module coupled to the switch module.

55 Claims, 30 Drawing Sheets

RISING EDGE PULSE GENERATOR

FALLING-EDGE PULSE GENERATOR

IMPEDENCE MATCHED ALIASING MODULE

ALIASING MODULE

INFORMATION SIGNAL 1302

OSCILLATING SIGNAL 1304

FREQUENCY MODULATED INPUT SIGNAL 1306

HARMONICALLY RICH SIGNAL (SHOWN AS SQUARE WAVE) 1308

SEE FIG. 13E

HARMONICS OF SIGNALS 1310 AND 1312 (SHOWN SIMULTANEOUSLY BUT NOT SUMMED)

1310     1312

FILTERED OUTPUT SIGNAL 1314

1310C     1312C

REAL-TIME WIRELESS EXCHANGE OF OBJECTS

CROSS-REFERENCE TO RELATED APPLICATIONS

This application claims the benefit of U.S. Provisional Application Ser. No. 60/466,419, filed Apr. 30, 2003, incorporated herein by reference in its entirety.

The following patents and patent applications of common assignee are related to the present application, and are herein incorporated by reference in their entireties:

U.S. Pat. No. 6,061,551, entitled "Method and System for Down-Converting Electromagnetic Signals," filed Oct. 21, 1998 and issued May 9, 2000.

U.S. Pat. No. 6,091,940, entitled "Method and System for Frequency Up-Conversion," filed Oct. 21, 1998 and issued Jul. 18, 2000.

U.S. Pat. No. 6,049,706, entitled "Integrated Frequency Translation And Selectivity," filed Oct. 21, 1998 and issued Apr. 11, 2000.

U.S. Pat. No. 6,370,371, entitled "Applications of Universal Frequency Translation," filed Mar. 3, 1999 and issued Apr. 9, 2002.

"Method, System, and Apparatus for Balanced Frequency Up-Conversion of a Baseband Signal," Ser. No. 09/525,615, filed Mar. 14, 2000.

"Method and System for Down-converting an Electromagnetic Signal, and Transforms for Same, and Aperture Relationships," Ser. No. 09/550,644, filed Apr. 14, 2000.

"DC Offset, Re-radiation, and I/Q Solutions Using Universal Frequency Translation Technology," Ser. No. 09/526,041, filed Mar. 14, 2000.

BACKGROUND OF THE INVENTION

1. Field of the Invention

The present invention relates generally to the down-conversion and up-conversion of an electromagnetic signal using a universal frequency translation module.

2. Related Art

Various communication components exist for performing frequency down-conversion, frequency up-conversion, and filtering. Also, schemes exist for signal reception in the face of potential jamming signals.

SUMMARY OF THE INVENTION

Briefly stated, the present invention is directed to a system, method, and computer program product for automatically exchanging objects in a wireless mobile environment. The invention operates by transmitting a request for objects to a source, receiving at least some of the requested objects from the source, and processing the received objects.

Preferably, the invention uses a frequency down-conversion module that comprises a switch, a capacitor coupled to the switch, and a pulse generator coupled to the switch. The pulse generator outputs pulses to the switch, where the pulses have apertures and cause the switch to close and sub-sample a carrier signal over the apertures. Energy is transferred from the carrier signal and stored using the capacitor during the apertures of the pulses, and a lower frequency signal is generated from the transferred energy.

Preferably, the invention also uses a frequency up-conversion module.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is generally indicated by the leftmost digit(s) in the corresponding reference number.

BRIEF DESCRIPTION OF THE DRAWINGS/FIGURES

The invention shall be described with reference to the accompanying figures, wherein.

Figure 7A:
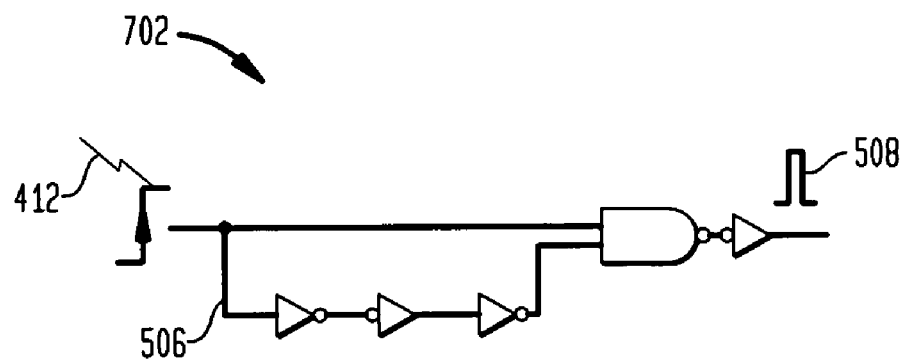
Figure 7B:
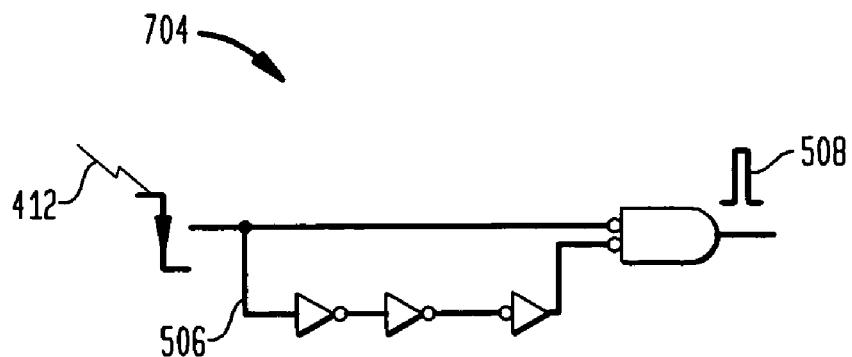

FIGS. 7A–B illustrate example aperture generators.

Figure 8:
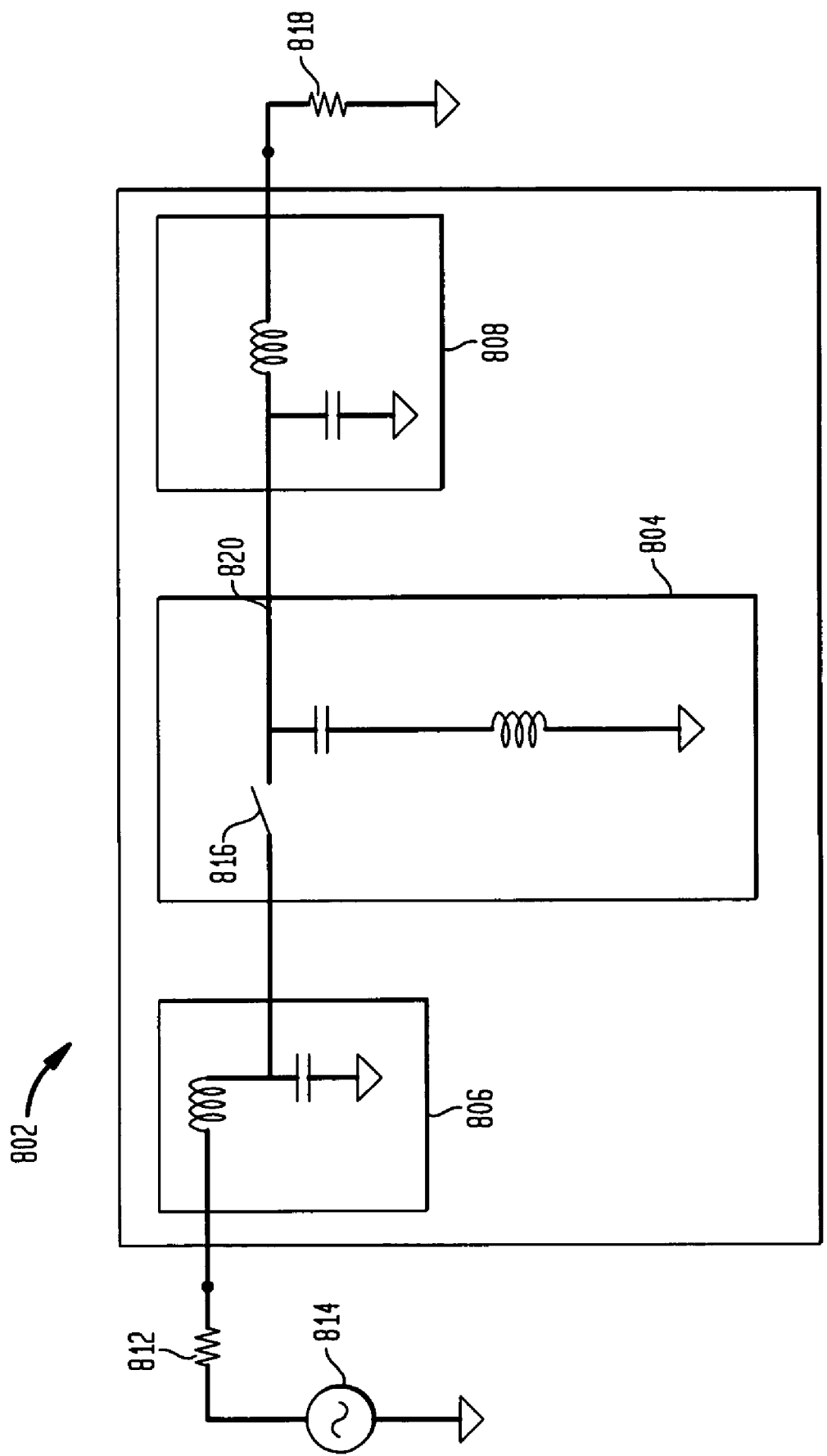

FIG. 8 illustrates an aliasing module with input and output impedance match according to an embodiment of the invention.

Figure 9:
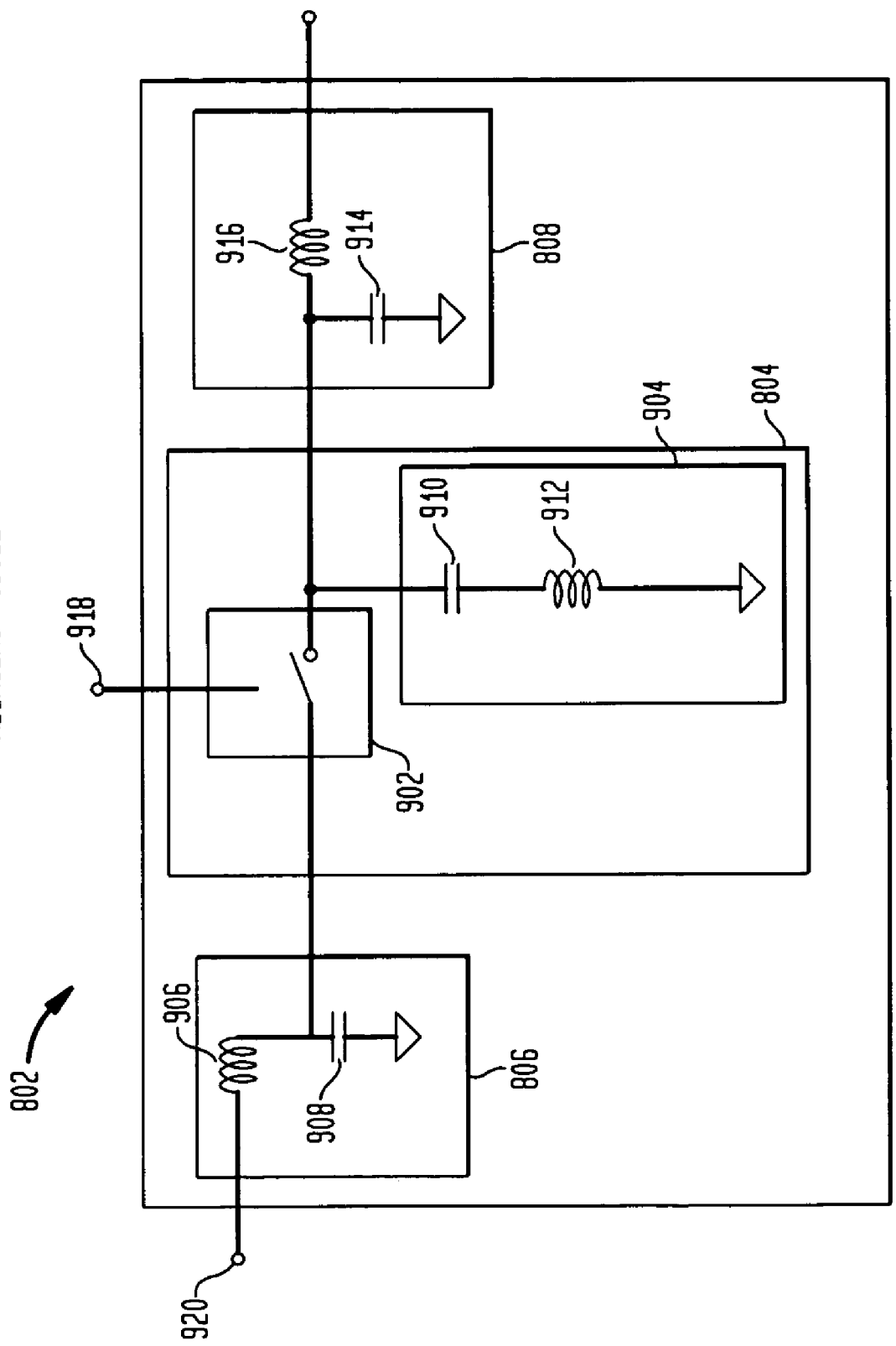

FIG. 9 illustrates an example energy transfer module with a switch module and a reactive storage module according to an embodiment of the invention.

Figure 10:
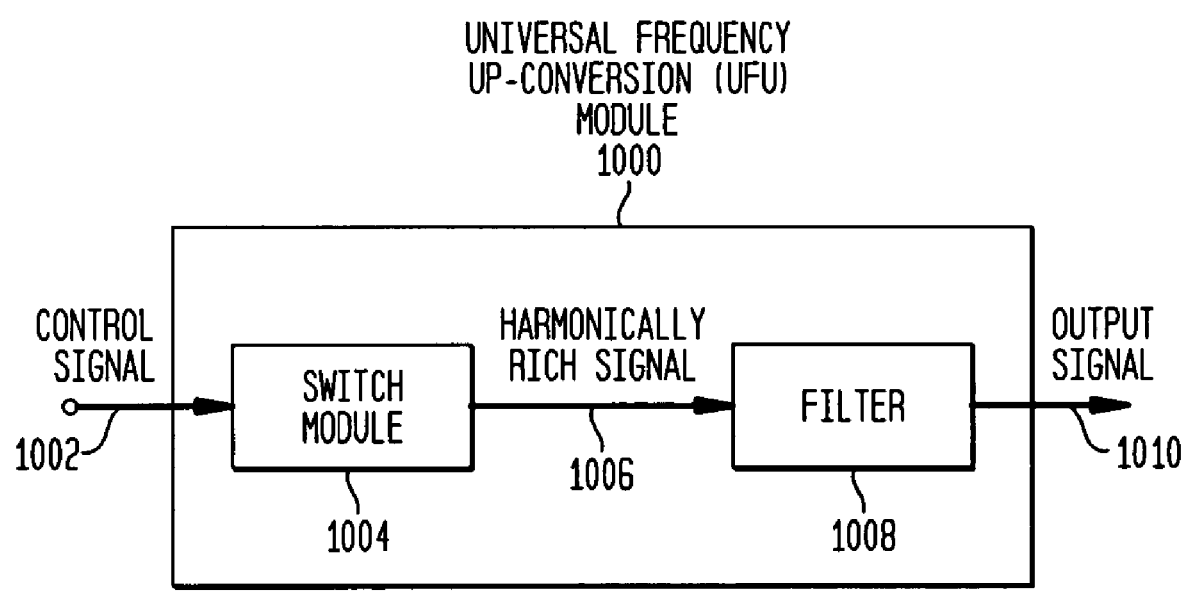

FIG. 10 is a block diagram of a universal frequency up-conversion (UFU) module according to an embodiment of the invention.

Figure 11:
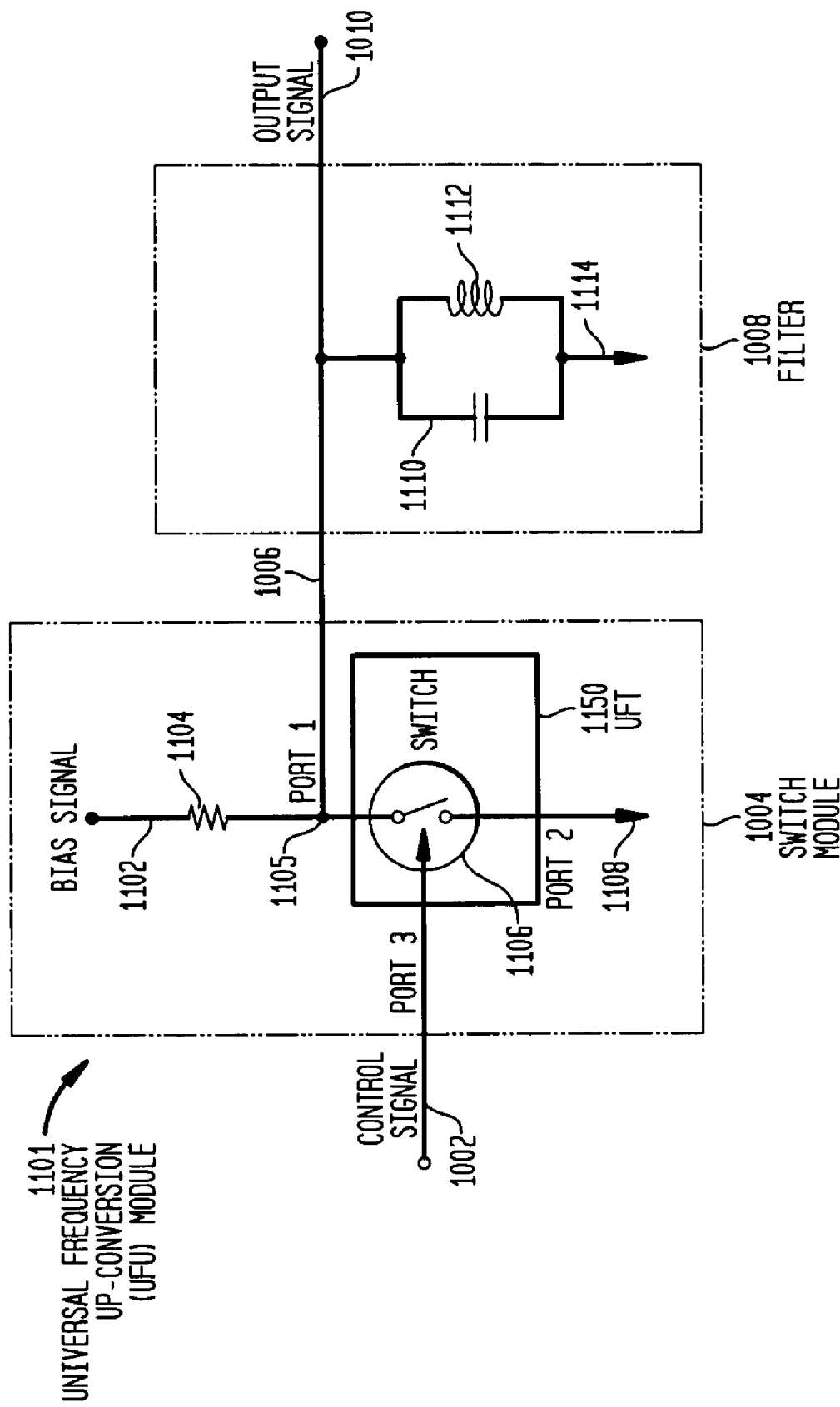

FIG. 11 is a more detailed diagram of a universal frequency up-conversion (UFU) module according to an embodiment of the invention.

Figure 12:
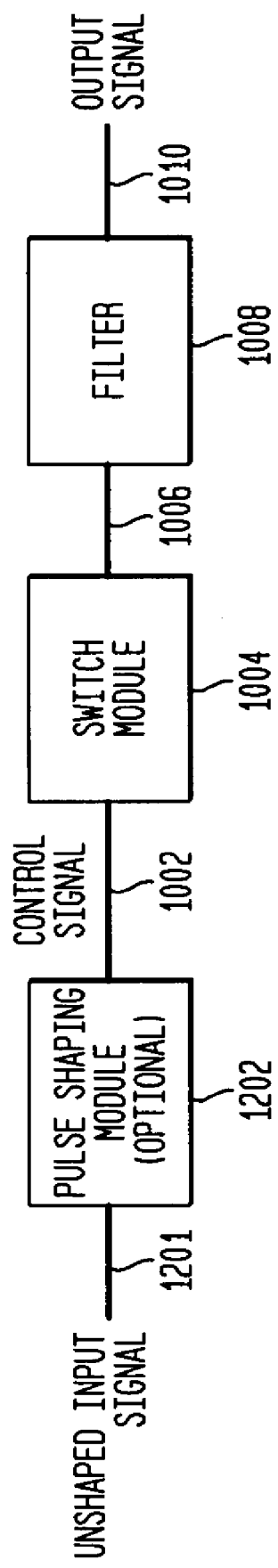

FIG. 12 is a block diagram of a universal frequency up-conversion (UFU) module according to an alternative embodiment of the invention.

FIGS. 13A–13I illustrate example waveforms used to describe the operation of the UFU module.

Figure 14:
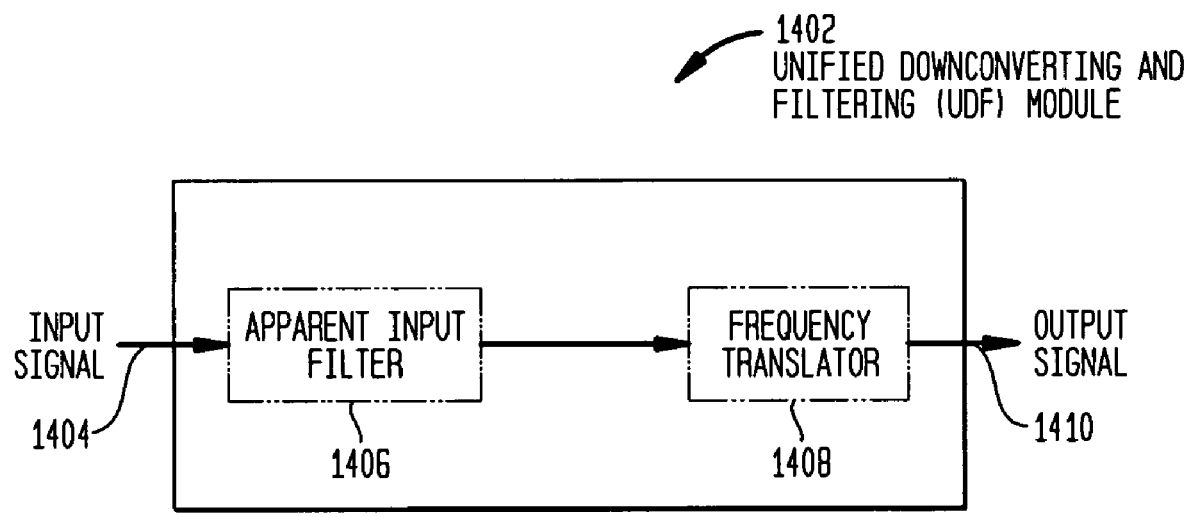

FIG. 14 illustrates a unified down-converting and filtering (UDF) module according to an embodiment of the invention.

Figure 15:
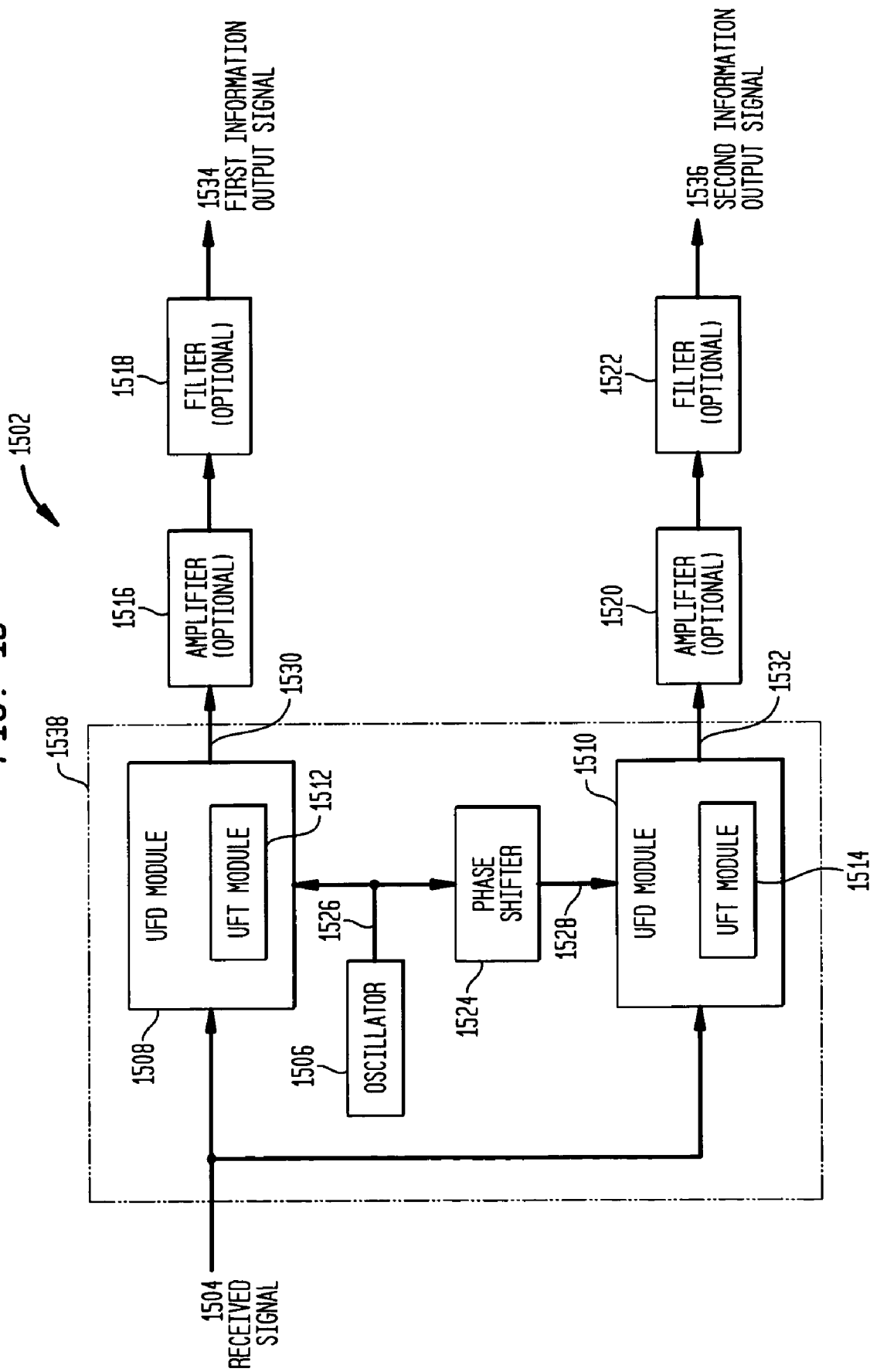

FIG. 15 illustrates an exemplary I/Q modulation embodiment of a receiver according to the invention.

Figure 16:
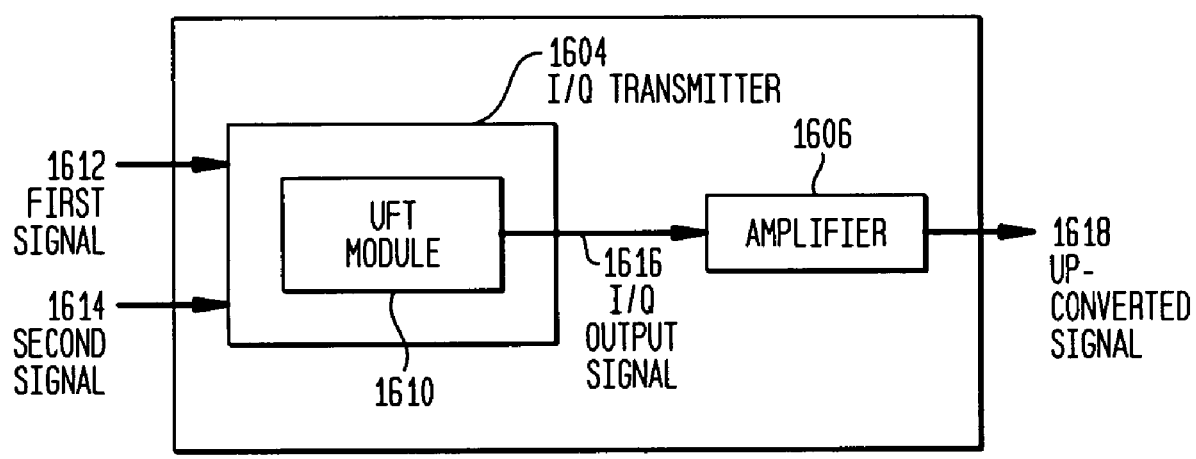
Figure 17:
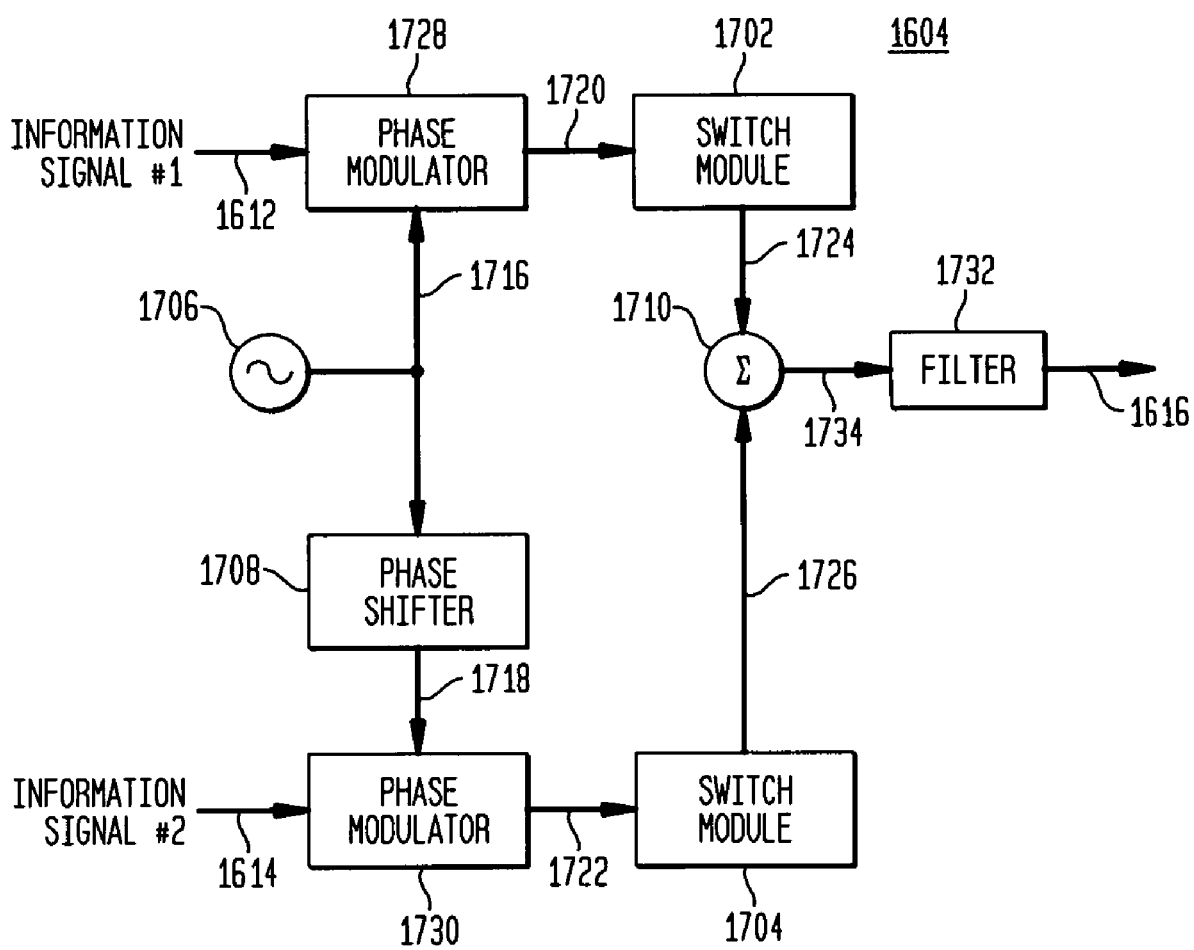

FIGS. 16–17 illustrate exemplary block diagrams of a transmitter operating in an I/Q modulation mode, according to embodiments of the invention.

Figure 18:
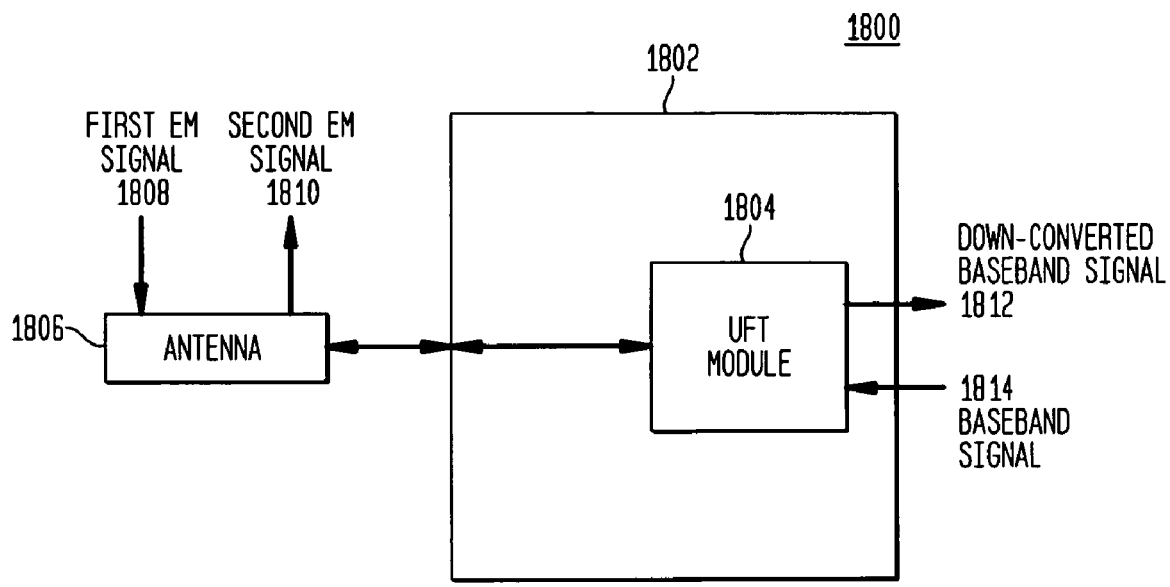

FIG. 18 illustrates a block diagram of a transceiver implementation according to an embodiment of the present invention.

Figure 19:
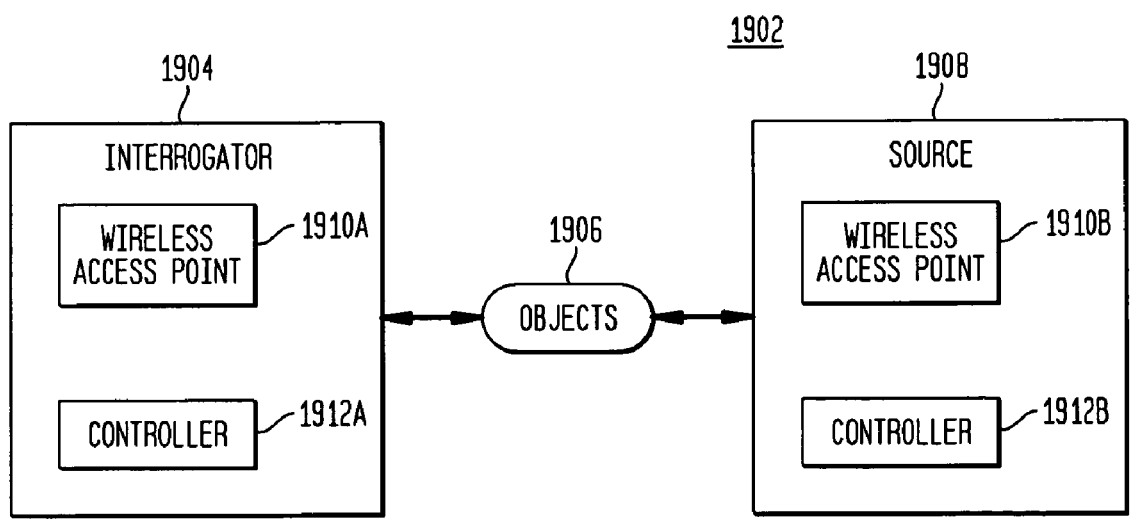

FIG. 19 illustrates an example scenario related to an example real-time wireless exchange of objects application of the invention.

Figure 20:
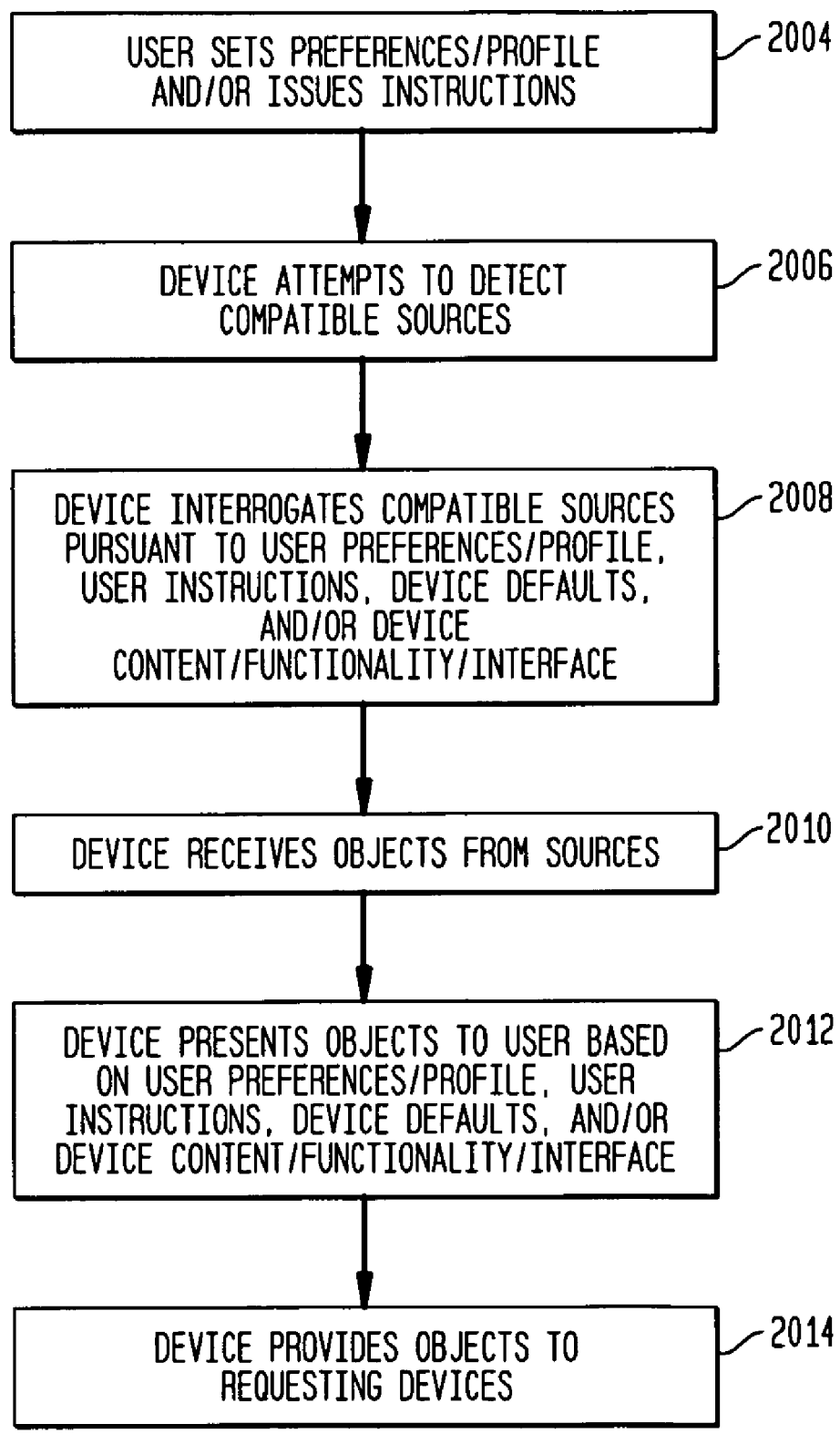

FIG. 20 is an example operational diagram related to the example real-time wireless exchange of objects application of the invention of FIG. 19.

Figure 21:
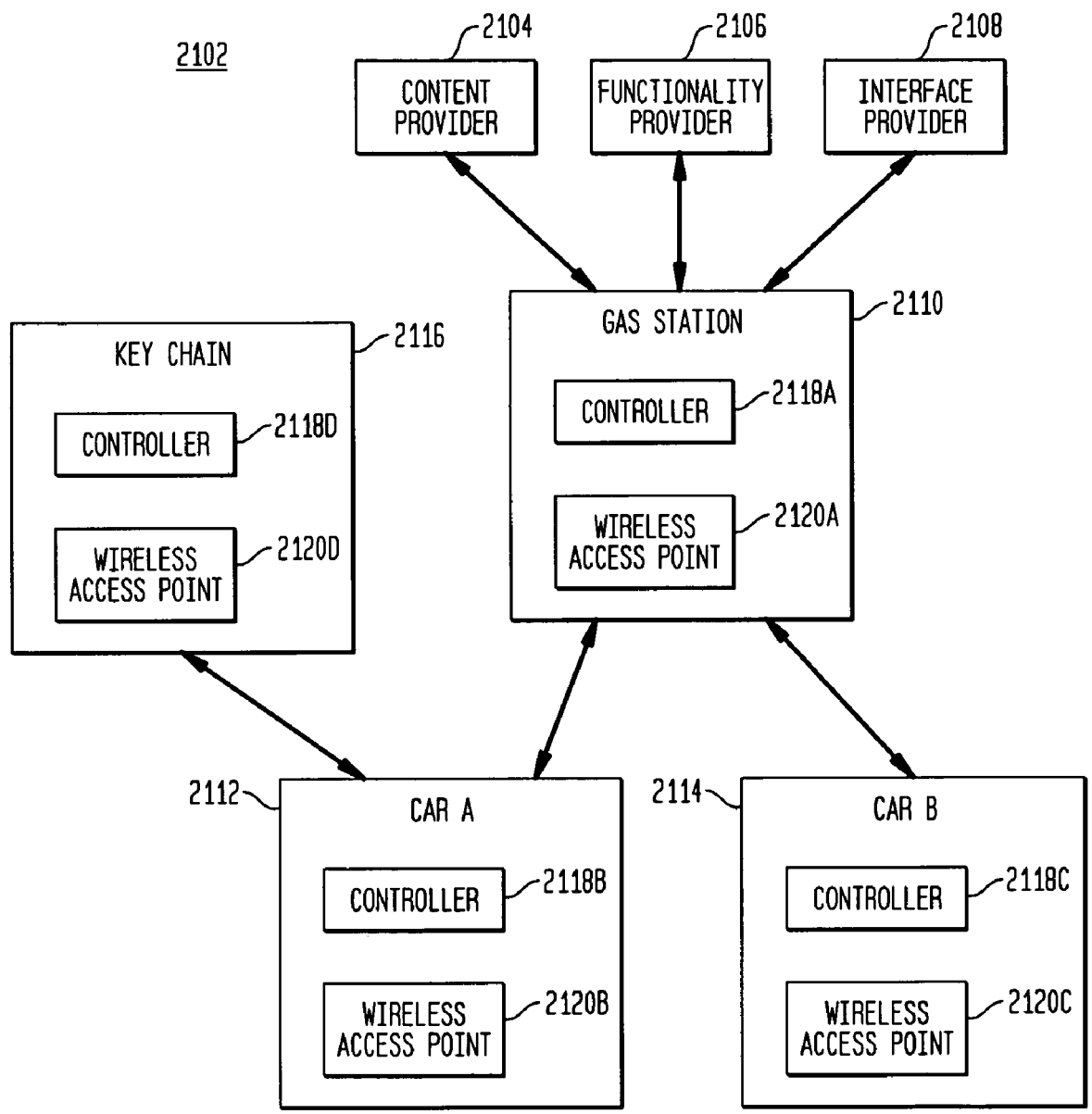

FIG. 21 is a more specific example scenario and block diagram of the example real-time wireless exchange of objects application of the invention.

Figure 22:
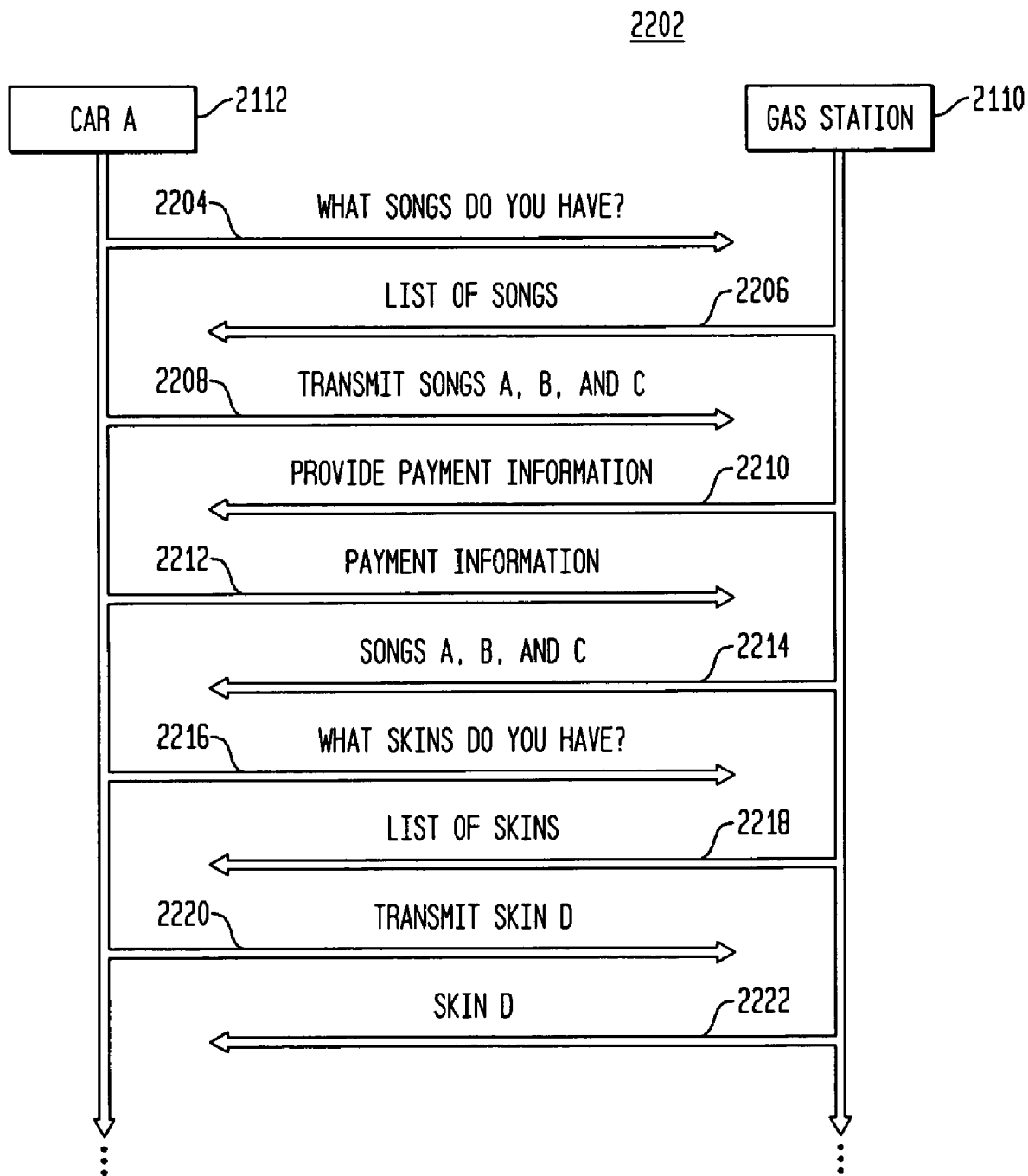
Figure 23:
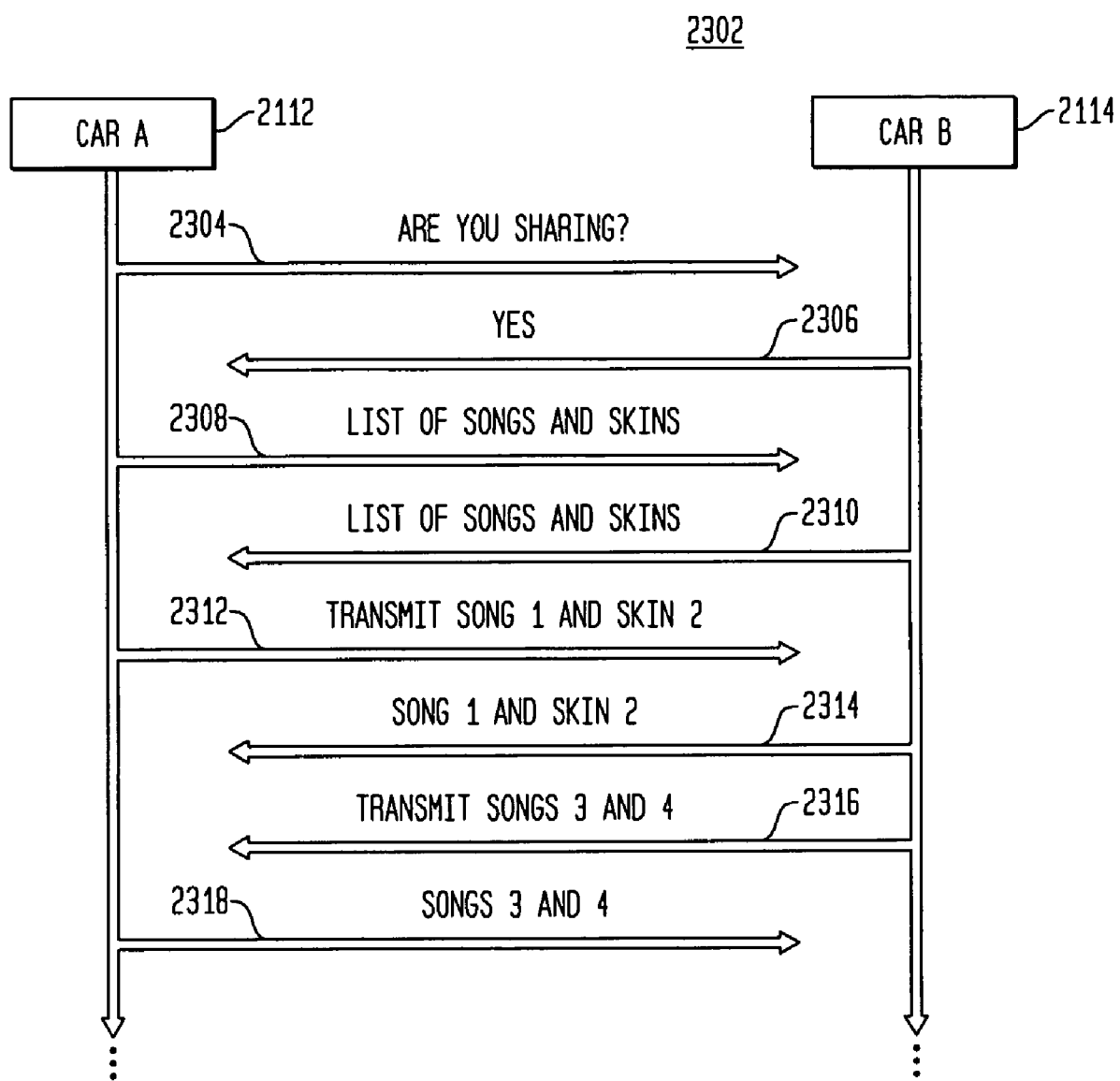

FIGS. 22 and 23 are example event diagrams relating to the example real-time wireless exchange of objects application of the invention.

Figure 24:
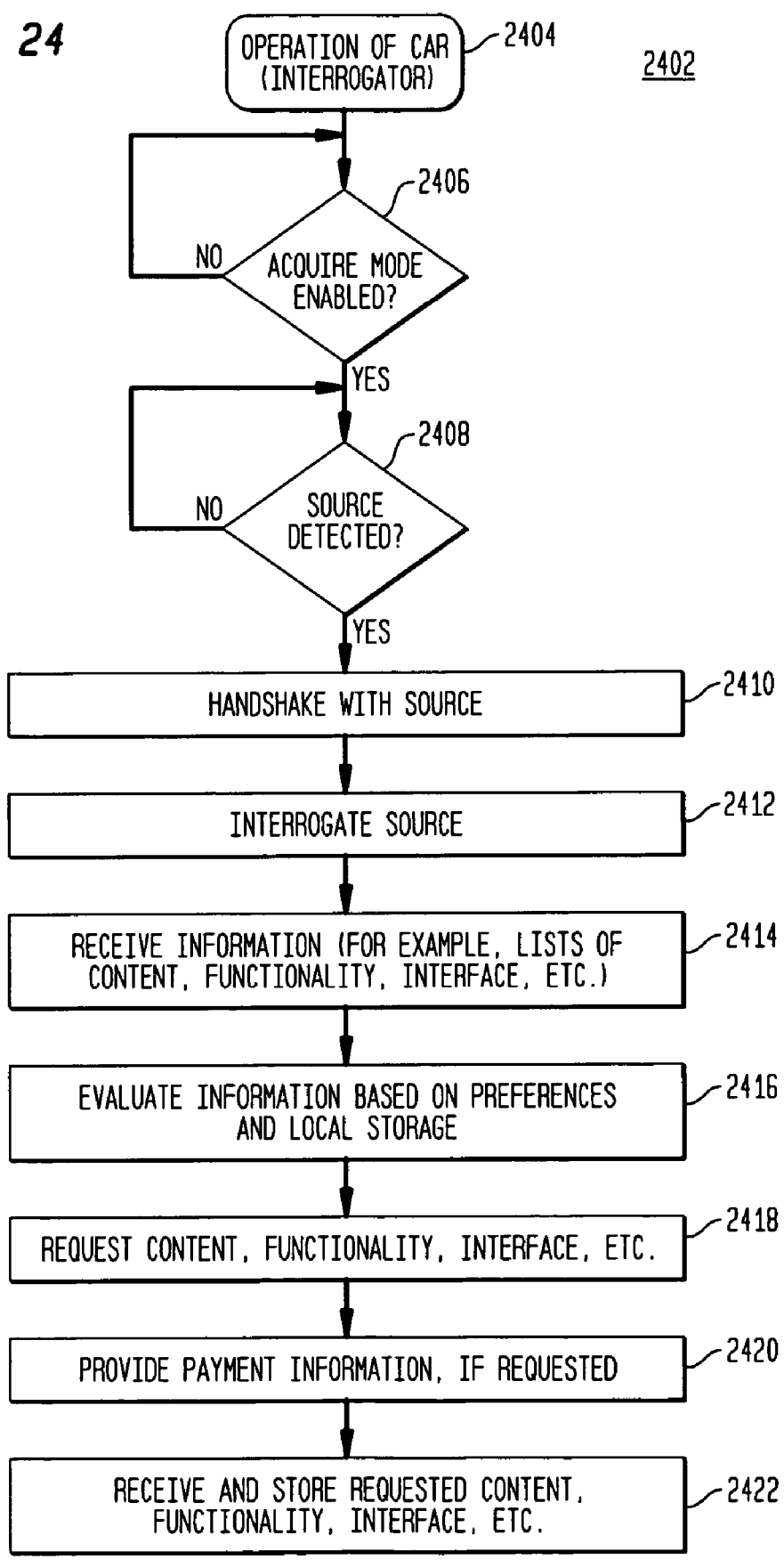

FIG. 24 is an example interrogator operational diagram relating to the real-time wireless exchange of objects application of the invention.

Figure 25:
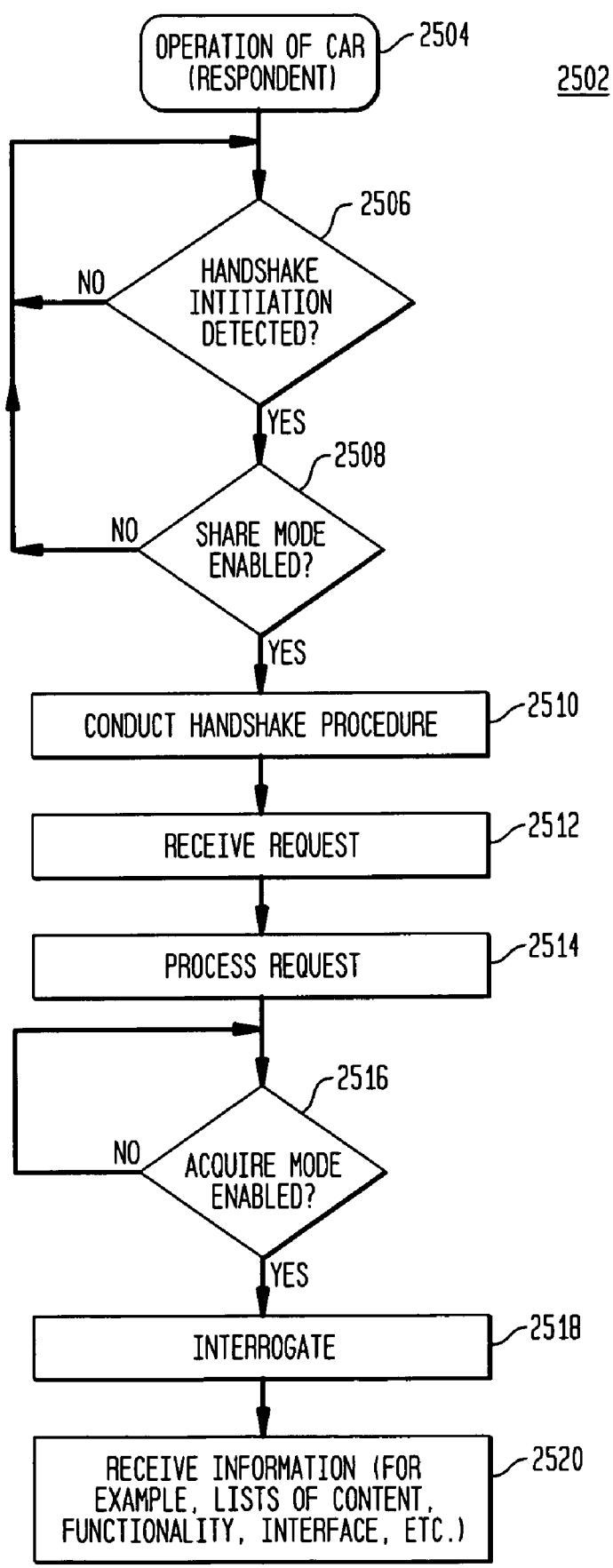

FIG. 25 is an example source (respondent) operational diagram relating to the real-time wireless exchange of objects application of the invention.

Figure 26:
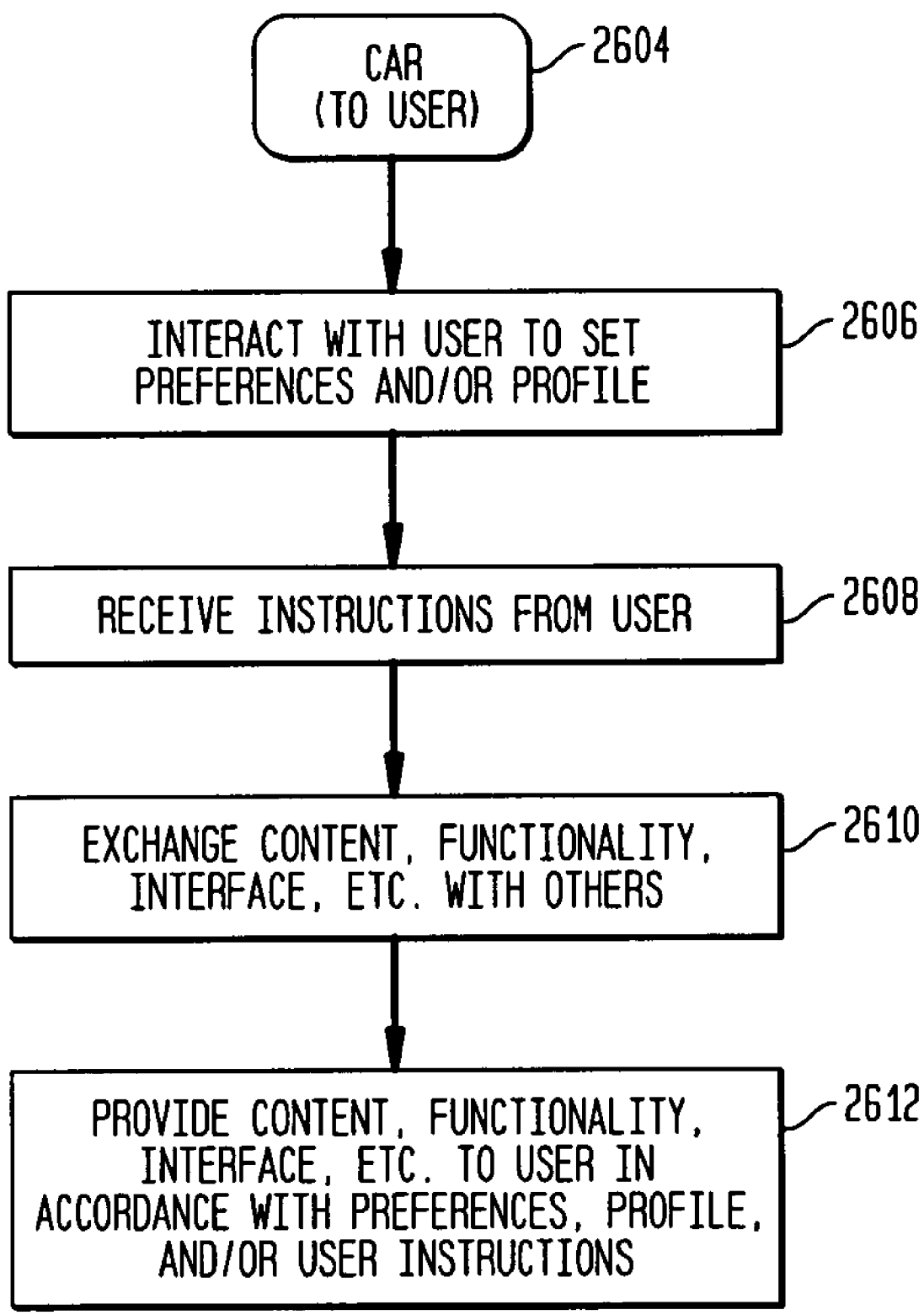

FIG. 26 is an example operational diagram depicting the interaction with a user relating to the real-time wireless exchange of objects application of the invention.

DETAILED DESCRIPTION OF THE INVENTION

Introduction

The present invention is directed to the down-conversion and up-conversion of an electromagnetic signal using a universal frequency translation (UFT) module, transforms for same, and applications thereof. The systems described herein each may include one or more receivers, transmitters, and transceivers. According to embodiments of the invention, at least some of these receivers, transmitters, and transceivers are implemented using universal frequency translation (UFT) modules. The UFT modules perform frequency translation operations. Embodiments of the present invention incorporating various applications of the UFT module are described below.

Systems that transmit and receive EM signals using UFT modules exhibit multiple advantages. These advantages include, but are not limited to, lower power consumption, longer power source life, fewer parts, lower cost, less tuning, and more effective signal transmission and reception. These systems can receive and transmit signals across a broad frequency range. The structure and operation of embodiments of the UFT module, and various applications of the same are described in detail in the following sections, and in the referenced documents.

Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
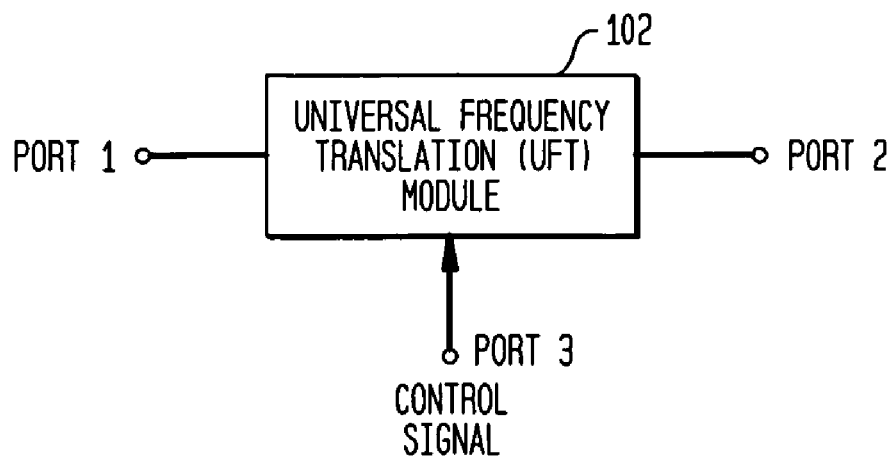
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
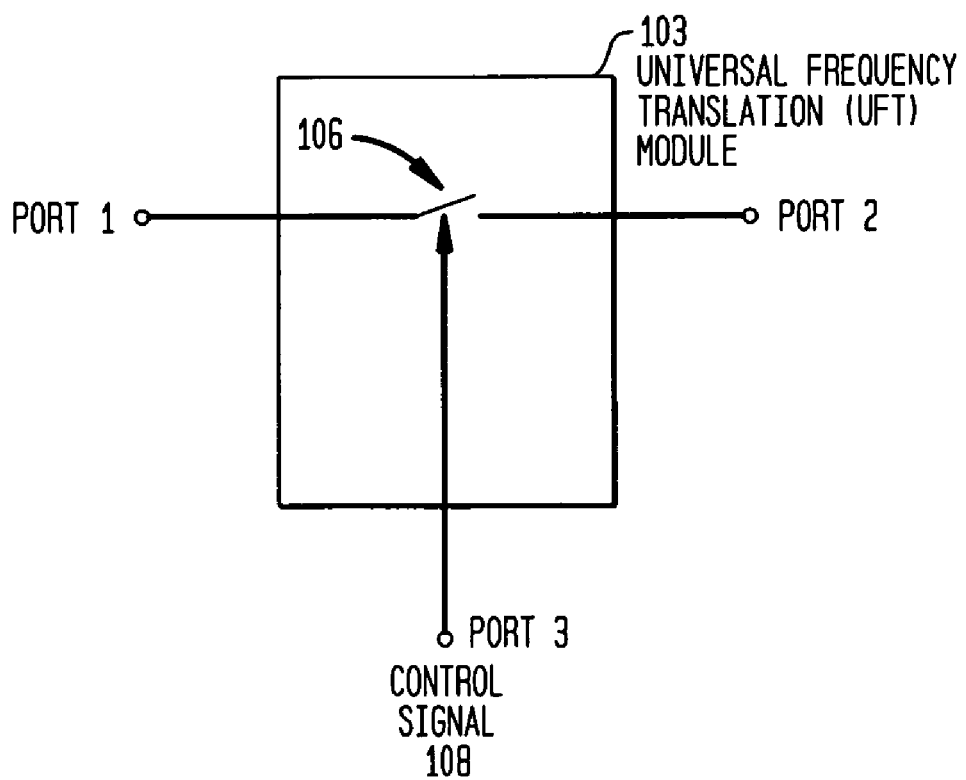
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
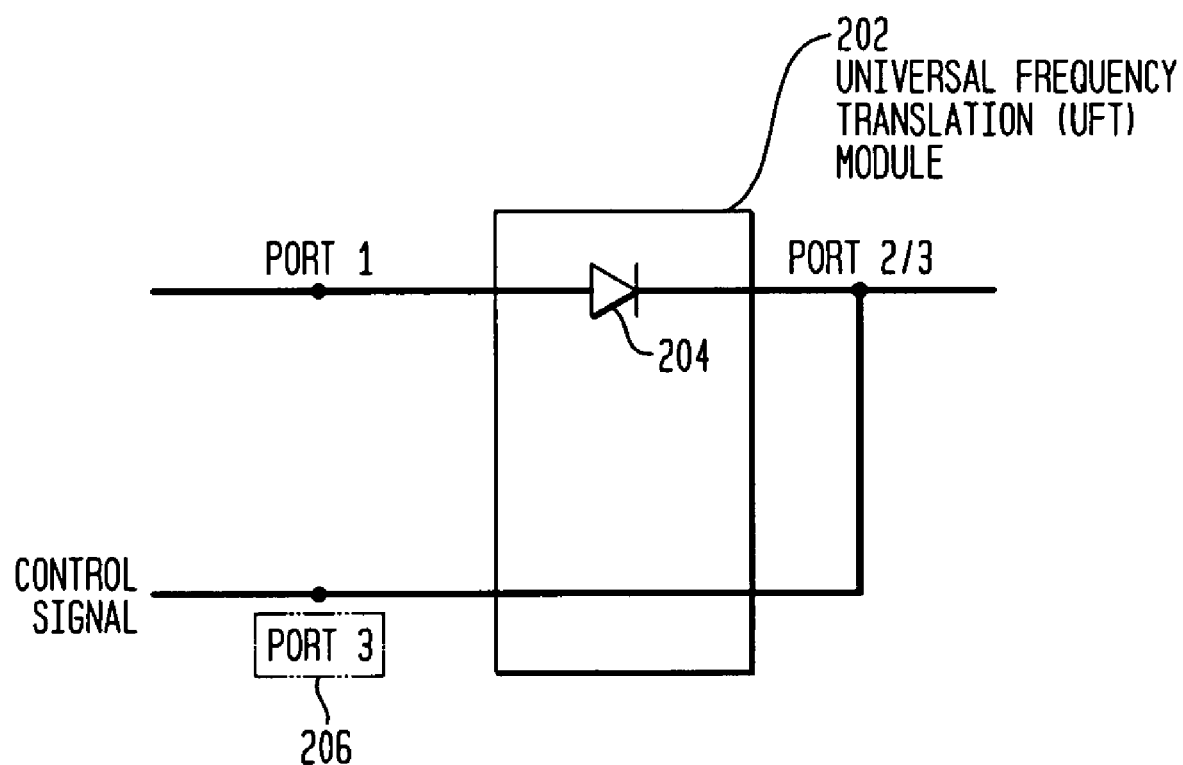
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
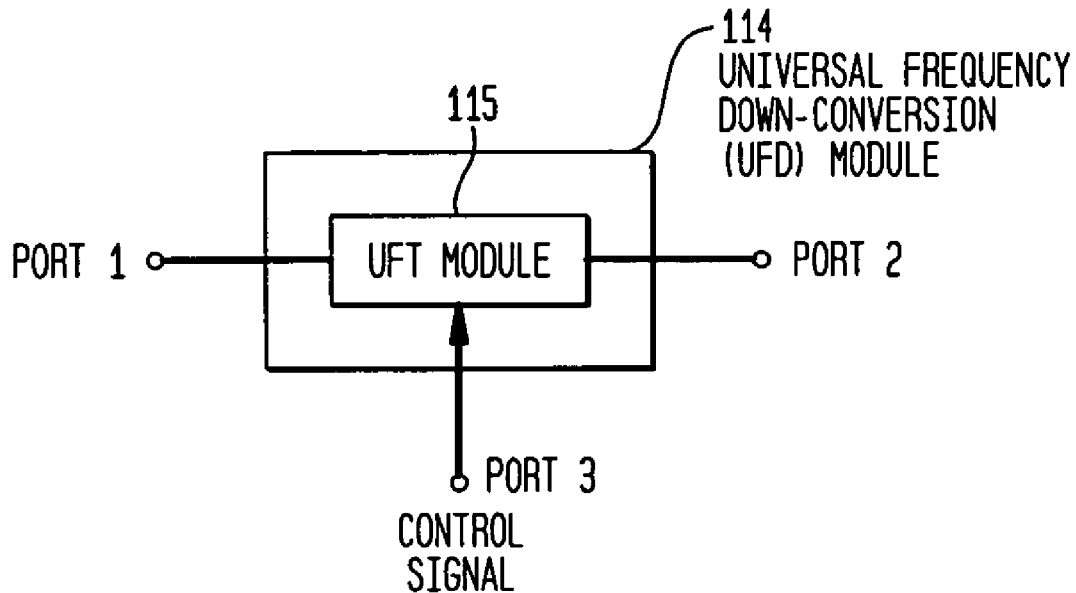
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
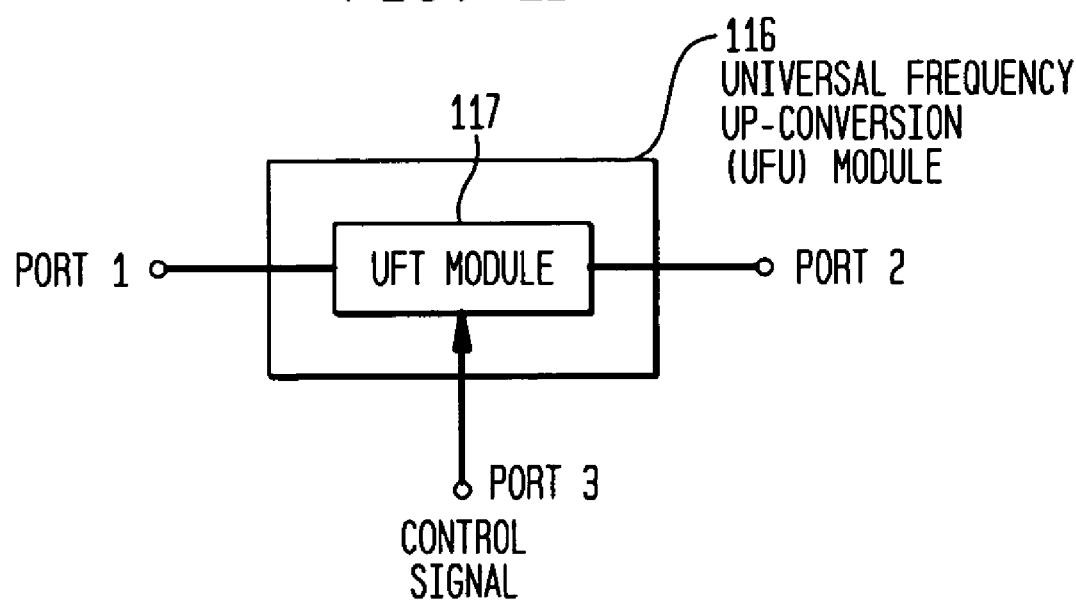
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. Pat. No. 6,061,551 entitled "Method and System for Down-Converting Electromagnetic Signals," assigned to the assignee of the present invention, the full disclosure of which is incorporated herein by reference. A relevant portion of the above-mentioned patent is summarized below to describe down-converting an input signal to produce a down-converted signal that exists at a lower frequency or a baseband signal. The frequency translation aspects of the invention are further described in other documents referenced above, such as application Ser. No. 09/550,644, entitled "Method and System for Down-converting an Electromagnetic Signal, and Transforms for Same, and Aperture Relationships."

Figure 3A:
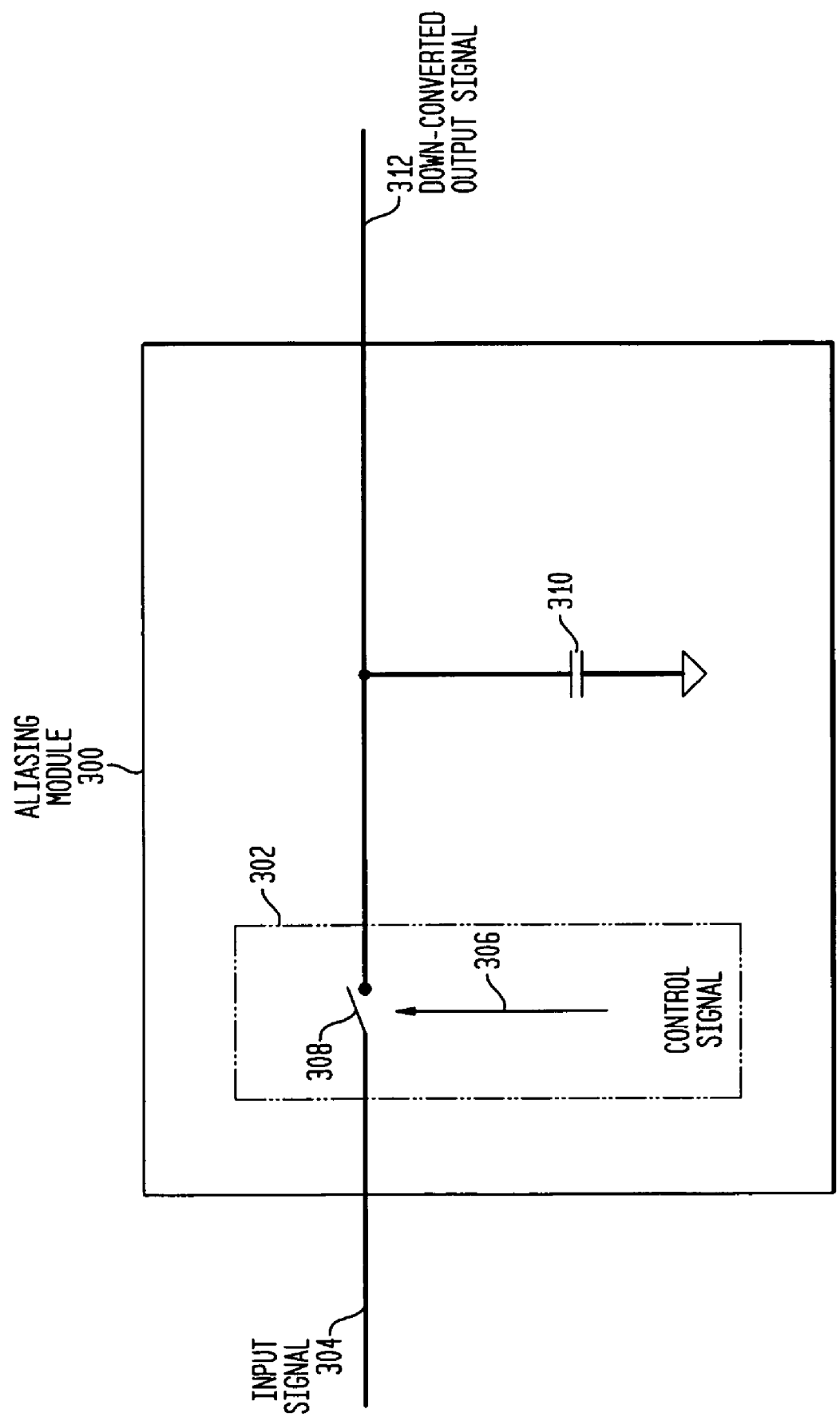
FIGS. 3A and 3G are example aliasing modules according to embodiments of the invention.

FIG. 3A illustrates an aliasing module 300 for down-conversion using a universal frequency translation (UFT) module 302 which down-converts an EM input signal 304. In particular embodiments, aliasing module 300 includes a switch 308 and a capacitor 310 (or integrator). (In embodiments, the UFT module is considered to include the switch and integrator.) The electronic alignment of the circuit components is flexible. That is, in one implementation, the switch 308 is in series with input signal 304 and capacitor 310 is shunted to ground (although it may be other than ground in configurations such as differential mode). In a second implementation (see FIG. 3G), the capacitor 310 is in series with the input signal 304 and the switch 308 is shunted to ground (although it may be other than ground in configurations such as differential mode). Aliasing module 300 with UFT module 302 can be tailored to down-convert a wide variety of electromagnetic signals using aliasing frequencies that are well below the frequencies of the EM input signal 304.

In one implementation, aliasing module 300 down-converts the input signal 304 to an intermediate frequency (IF) signal. In another implementation, the aliasing module 300 down-converts the input signal 304 to a demodulated baseband signal. In yet another implementation, the input signal 304 is a frequency modulated (FM) signal, and the aliasing module 300 down-converts it to a non-FM signal, such as a phase modulated (PM) signal or an amplitude modulated (AM) signal. Each of the above implementations is described below.

In an embodiment, the control signal 306 includes a train of pulses that repeat at an aliasing rate that is equal to, or less than, twice the frequency of the input signal 304. In this embodiment, the control signal 306 is referred to herein as an aliasing signal because it is below the Nyquist rate for the frequency of the input signal 304. Preferably, the frequency of control signal 306 is much less than the input signal 304.

Figure 3B:
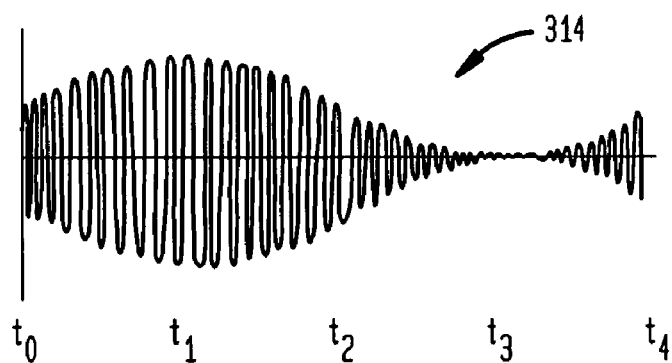
FIGS. 3B–3F are example waveforms used to describe the operation of the aliasing modules of FIGS. 3A and 3G.
Figure 3C:
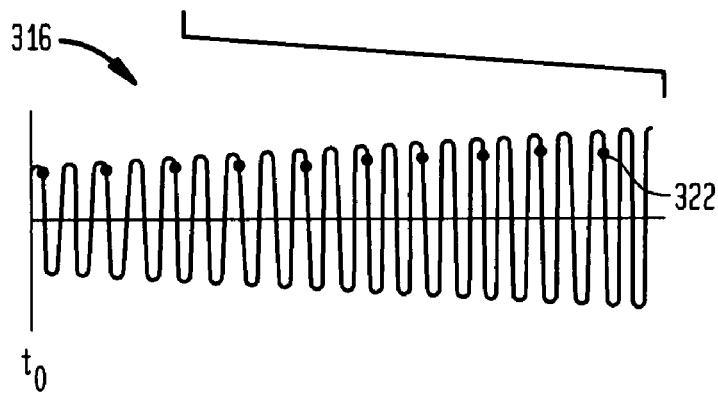
Figure 3D:
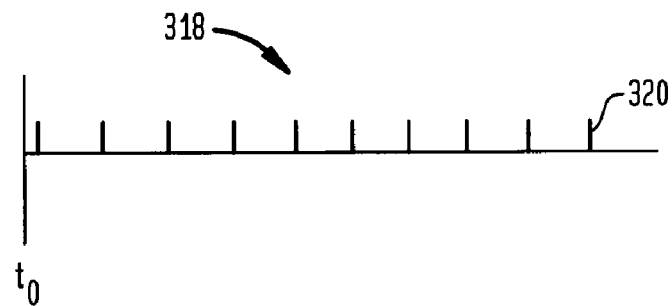
Figure 3E:
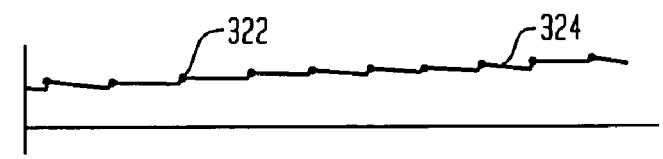

A train of pulses 318 as shown in FIG. 3D controls the switch 308 to alias the input signal 304 with the control signal 306 to generate a down-converted output signal 312. More specifically, in an embodiment, switch 308 closes on a first edge of each pulse 320 of FIG. 3D and opens on a second edge of each pulse. When the switch 308 is closed, the input signal 304 is coupled to the capacitor 310, and charge is transferred from the input signal to the capacitor 310. The charge stored during successive pulses forms down-converted output signal 312.

Exemplary waveforms are shown in FIGS. 3B–3F.

FIG. 3B illustrates an analog amplitude modulated (AM) carrier signal 314 that is an example of input signal 304. For illustrative purposes, in FIG. 3C, an analog AM carrier signal portion 316 illustrates a portion of the analog AM carrier signal 314 on an expanded time scale. The analog AM carrier signal portion 316 illustrates the analog AM carrier signal 314 from time to to time $t_1$.

FIG. 3D illustrates an exemplary aliasing signal 318 that is an example of control signal 306. Aliasing signal 318 is on approximately the same time scale as the analog AM carrier signal portion 316. In the example shown in FIG. 3D, the aliasing signal 318 includes a train of pulses 320 having negligible apertures that tend towards zero (the invention is not limited to this embodiment, as discussed below). The pulse aperture may also be referred to as the pulse width as will be understood by those skilled in the art(s). The pulses 320 repeat at an aliasing rate, or pulse repetition rate of aliasing signal 318. The aliasing rate is determined as described below, and further described in U.S. Pat. No. 6,061,551 entitled "Method and System for Down-Converting Electromagnetic Signals."

Figure 3F:
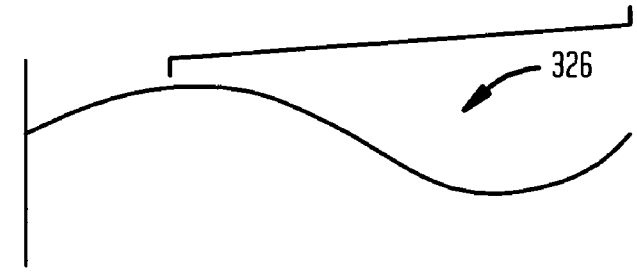

As noted above, the train of pulses 320 (i.e., control signal 306) control the switch 308 to alias the analog AM carrier signal 316 (i.e., input signal 304) at the aliasing rate of the aliasing signal 318. Specifically, in this embodiment, the switch 308 closes on a first edge of each pulse and opens on a second edge of each pulse. When the switch 308 is closed, input signal 304 is coupled to the capacitor 310, and charge is transferred from the input signal 304 to the capacitor 310. The charge transferred during a pulse is referred to herein as an under-sample. Exemplary under-samples 322 form down-converted signal portion 324 (FIG. 3E) that corresponds to the analog AM carrier signal portion 316 (FIG. 3C) and the train of pulses 320 (FIG. 3D). The charge stored during successive under-samples of AM carrier signal 314 form the down-converted signal 324 (FIG. 3E) that is an example of down-converted output signal 312 (FIG. 3A). In FIG. 3F, a demodulated baseband signal 326 represents the demodulated baseband signal 324 after filtering on a compressed time scale. As illustrated, down-converted signal 326 has substantially the same "amplitude envelope" as AM carrier signal 314. Therefore, FIGS. 3B–3F illustrate down-conversion of AM carrier signal 314.

The waveforms shown in FIGS. 3B–3F are discussed herein for illustrative purposes only, and are not limiting. Additional exemplary time domain and frequency domain drawings, and exemplary methods and systems of the invention relating thereto, are disclosed in U.S. Pat. No. 6,061,551 entitled "Method and System for Down-Converting Electromagnetic Signals."

The aliasing rate of control signal 306 determines whether the input signal 304 is down-converted to an IF signal, down-converted to a demodulated baseband signal, or down-converted from an FM signal to a PM or an AM signal. Generally, relationships between the input signal 304, the aliasing rate of the control signal 306, and the down-converted output signal 312 are illustrated below:

(Freq. of input signal 304)=$n$·(Freq. of control signal 306)±(Freq. of down-converted output signal 312)

For the examples contained herein, only the "+" condition will be discussed. Example values of n include, but are not limited to, n={0.5, 1, 2, 3, 4, . . . }.

When the aliasing rate of control signal 306 is off-set from the frequency of input signal 304, or off-set from a harmonic or sub-harmonic thereof, input signal 304 is down-converted to an IF signal. This is because the under-sampling pulses occur at different phases of subsequent cycles of input signal 304. As a result, the under-samples form a lower frequency oscillating pattern. If the input signal 304 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 306 would be calculated as follows:

(Freq$_{input}$−Freq$_{IF}$)/$n$=Freq$_{control}$ (901 MHZ−1 MHZ)/$n$=900/$n$

For n={0.5, 1, 2, 3, 4, . . . }, the frequency of the control signal 306 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in U.S. Pat. No. 6,061,551 entitled "Method and System for Down-Converting Electromagnetic Signals."

Alternatively, when the aliasing rate of the control signal 306 is substantially equal to the frequency of the input signal 304, or substantially equal to a harmonic or sub-harmonic thereof, input signal 304 is directly down-converted to a demodulated baseband signal. This is because, without modulation, the under-sampling pulses occur at the same point of subsequent cycles of the input signal 304. As a result, the under-samples form a constant output baseband signal. If the input signal 304 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 306 would be calculated as follows:

(Freq$_{input}$−Freq$_{IF}$)/n=Freq$_{control}$ (900 MHZ−0 MHZ)/n=900 MHZ/n

For n={0.5, 1, 2, 3, 4, ... }, the frequency of the control signal 306 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in U.S. Pat. No. 6,061,551 entitled "Method and System for Down-Converting Electromagnetic Signals."

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2) \div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 306 would be calculated as follows:

$$\text{Frequency of the input} = (F_1 + F_2) \div 2$$
$$= (899 \text{ MHZ} + 901 \text{ MHZ}) \div 2$$
$$= 900 \text{ MHZ}$$

Frequency of the down-converted signal=0 (i.e., baseband)

(Freq$_{input}$−Freq$_{IF}$)/n=Freq$_{control}$ (900 MHZ−0 MHZ)/n=900 MHZ/n

For n={0.5, 1, 2, 3, 4, ... }, the frequency of the control signal 306 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 306 should be substantially equal to:

(900 MHZ−0 MHZ)/n=900 MHZ/n, or (901 MHZ−0 MHZ)/n=901 MHZ/n.

For the former case of 900 MHZ/n, and for n={0.5, 1, 2, 3, 4, ... }, the frequency of the control signal 306 should be substantially equal to 1.8 GHz, 900 MHZ, 450 MHZ, 300 MHZ, 225 MHZ, etc. For the latter case of 901 MHZ/n, and for n={0.5, 1, 2, 3, 4, ... }, the frequency of the control signal 306 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in U.S. Pat. No. 6,061,551 entitled "Method and System for Down-Converting Electromagnetic Signals."

In an embodiment, the pulses of the control signal 306 have negligible apertures that tend towards zero. This makes the UFT module 302 a high input impedance device. This configuration is useful for situations where minimal disturbance of the input signal may be desired.

In another embodiment, the pulses of the control signal 306 have non-negligible apertures that tend away from zero. This makes the UFT module 302 a lower input impedance device. This allows the lower input impedance of the UFT module 302 to be substantially matched with a source impedance of the input signal 304. This also improves the energy transfer from the input signal 304 to the down-converted output signal 312, and hence the efficiency and signal to noise (s/n) ratio of UFT module 302.

Exemplary systems and methods for generating and optimizing the control signal 306, and for otherwise improving energy transfer and s/n ratio, are disclosed in U.S. Pat. No. 6,061,551 entitled "Method and System for Down-Converting Electromagnetic Signals."

Figure 3G:
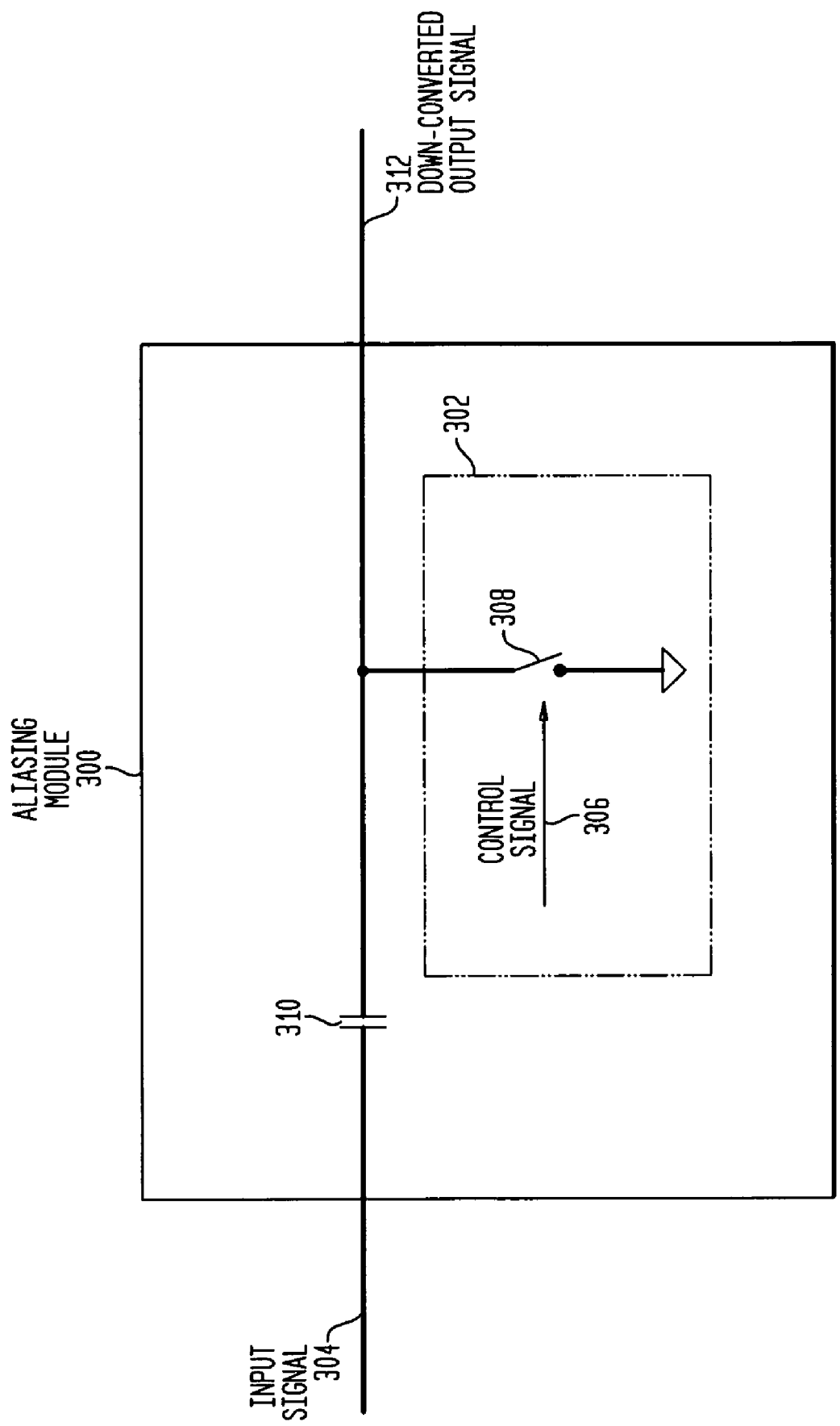

When the pulses of control signal 306 have non-negligible apertures, the aliasing module 300 is referred to interchangeably herein as an energy transfer module or a gated transfer module, and the control signal 306 is referred to as an energy transfer signal. In non-negligible aperture embodiments, when pulses cause switch 310 to close and sub-sample input signal 304 over the apertures or pulse widths, energy is transferred from input signal 304. The transferred energy is integrated using capacitor 310 during the apertures or pulse widths of the pulses. A frequency down-converted image, shown as down-converted output signal 312 in FIGS. 3A and 3G, is thereby generated from the transferred energy.

Figure 3H:
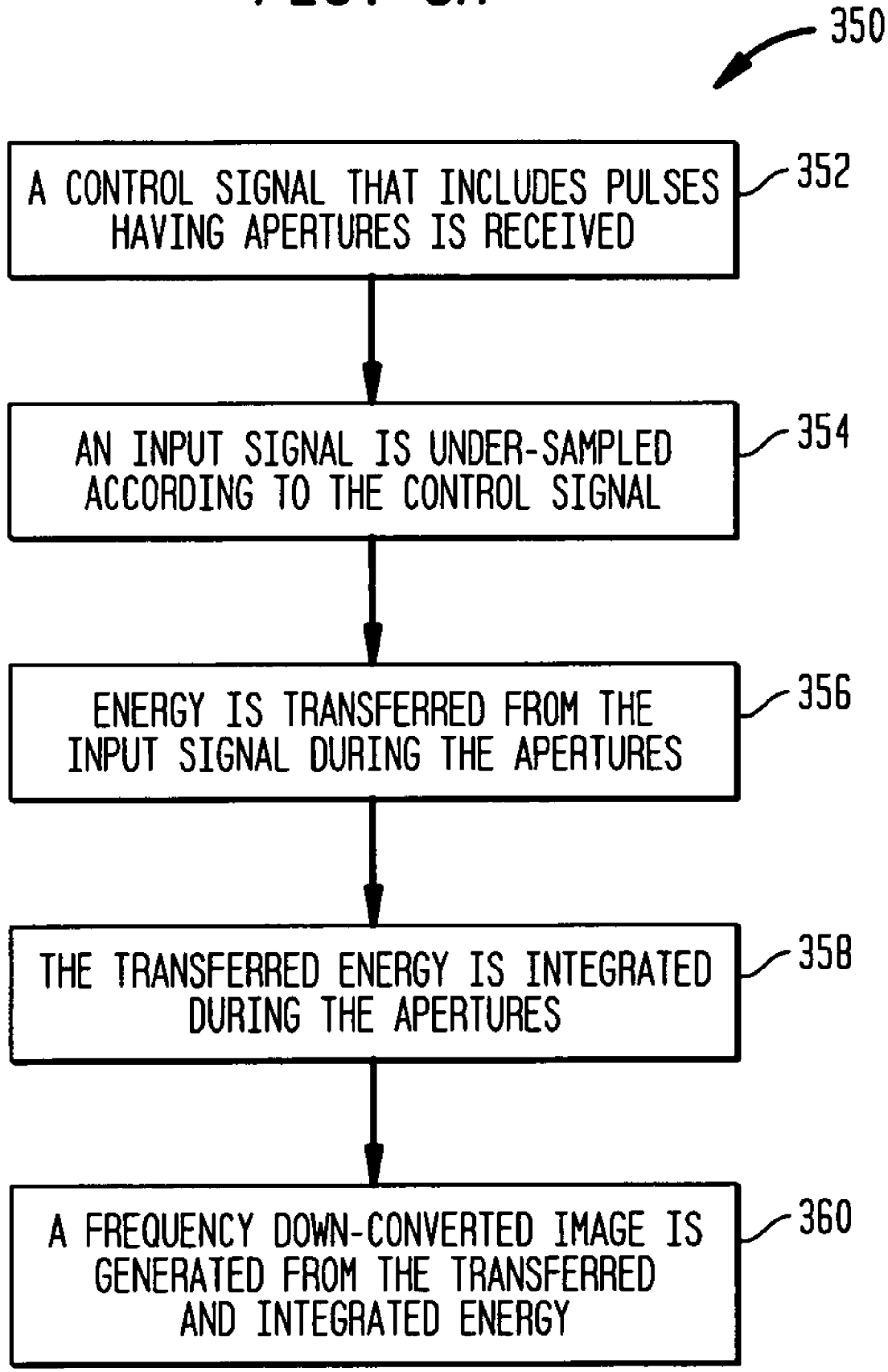
FIG. 3H is a flowchart depicting the operation of an energy transfer downconverter according to an embodiment of the invention.

FIG. 3H shows a flowchart 350 providing steps for down-converting an input signal using non-negligible apertures or pulse widths, according to an example embodiment of the present invention. Further structural and operational embodiments for performing down-conversion will be apparent to persons skilled in the relevant art(s) based on the following description. These steps are described in detail below Flowchart 350 begins with step 352. In step 352, a control signal that includes pulses having apertures is received. For example, in an embodiment, the control signal is control signal 306, as shown in FIG. 3A. In an embodiment, control signal 306 includes a train of pulses, such as train of pulses 318 shown in FIG. 3C. Pulses 320 of train of pulses 318 preferably have a non-negligible pulse width or aperture.

In step 354, an input signal is under-sampled according to the control signal. For example, in an embodiment, the input signal is input signal 304, shown in FIGS. 3A and 3G, which is under-sampled according to control signal 306. Input signal 304 can have a range of frequencies. For example, input signal 304 can be a radio frequency signal or an intermediate frequency signal, among other frequency signals. Preferably, the frequency of control signal 306 is much less than the input signal 304.

In step 356, energy is transferred from the input signal during the apertures. For example, in an embodiment, charge is transferred from input signal 304 during pulses 320 of control signal 306, and is stored in a storage device, such as capacitor 310 shown in FIGS. 3A and 3G. The amount of energy transfer from input signal 304 varies with the value of capacitor 310, the voltage of input signal 304, and with the aperture or pulse widths of pulses 320. Greater energy transfer is possible with wider apertures or pulse widths, and/or with larger values for capacitor 310. Note that in an embodiment, the transfer of energy from input signal 304 substantially prevents accurate voltage reproduction of input signal 304 during pulses 320.

In step 358, the transferred energy is integrated during the apertures. For example, in an embodiment, the energy transferred from input signal 304 is integrated by capacitor 310. Note that the present invention can accommodate alternative integrator types.

In step 360, a frequency down-converted image is generated from the transferred and integrated energy. For example, the frequency down-converted image that is generated from the transferred and integrated energy is down-converted signal 312, shown in FIGS. 3A and 3G. FIG. 3D shows down-converted signal portion 324, which is an example of down-converted signal 312, formed by under-samples 322.

Exemplary systems and methods for generating and optimizing the control signal 306 and for otherwise improving energy transfer and/or signal to noise ratio in an energy transfer module are described below.

Optional Energy Transfer Signal Module

Figure 4:
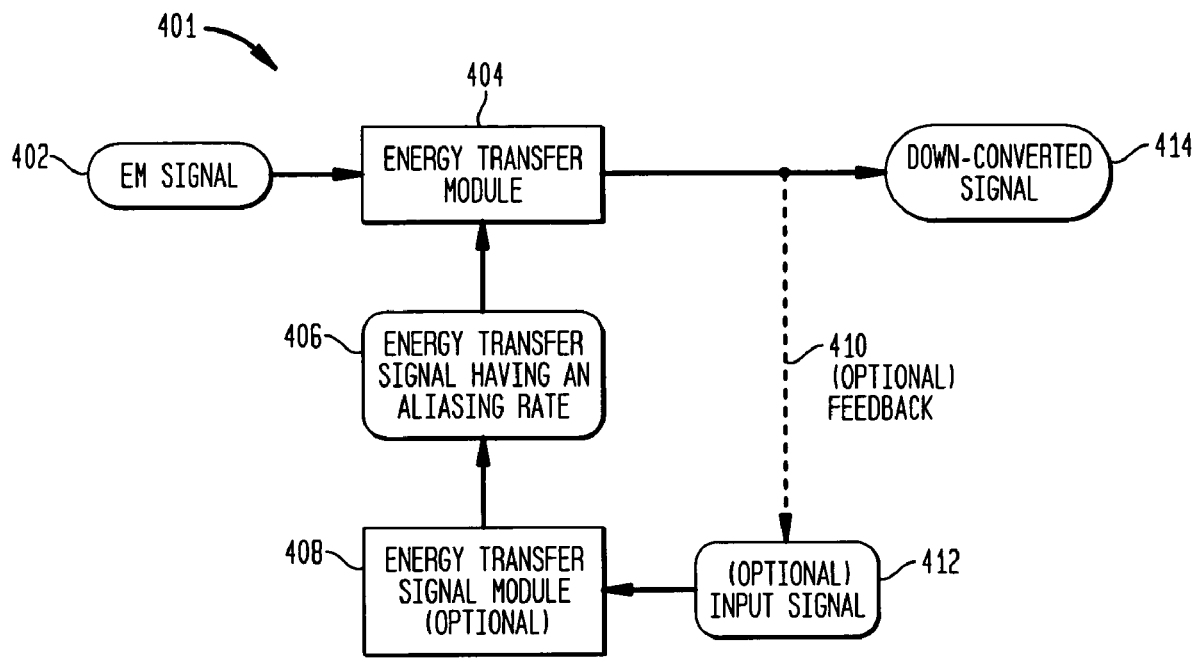
FIG. 4 illustrates an energy transfer system with an optional energy transfer signal module according to an embodiment of the invention.

FIG. 4 illustrates an energy transfer system 401 that includes an optional energy transfer signal module 408, which can perform any of a variety of functions or combinations of functions including, but not limited to, generating the energy transfer signal 406.

Figure 5:
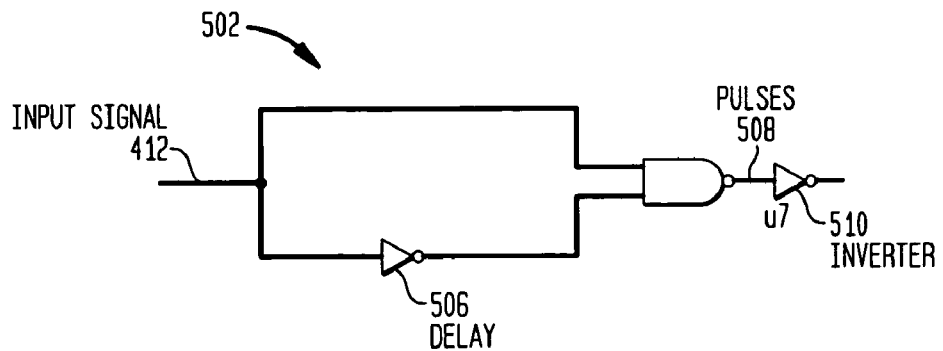
FIG. 5 illustrates an example aperture generator.

In an embodiment, the optional energy transfer signal module 408 includes an aperture generator, an example of which is illustrated in FIG. 5 as an aperture generator 502. The aperture generator 502 generates non-negligible aperture pulses 508 from an input signal 412. The input signal 412 can be any type of periodic signal, including, but not limited to, a sinusoid, a square wave, a saw-tooth wave, etc. Systems for generating the input signal 412 are described below.

The width or aperture of the pulses 508 is determined by delay through the branch 506 of the aperture generator 502. Generally, as the desired pulse width increases, the difficulty in meeting the requirements of the aperture generator 502 decrease (i.e., the aperture generator is easier to implement). In other words, to generate non-negligible aperture pulses for a given EM input frequency, the components utilized in the example aperture generator 502 do not require reaction times as fast as those that are required in an under-sampling system operating with the same EM input frequency.

The example logic and implementation shown in the aperture generator 502 are provided for illustrative purposes only, and are not limiting. The actual logic employed can take many forms. The example aperture generator 502 includes an optional inverter 510, which is shown for polarity consistency with other examples provided herein.

Figure 6A:
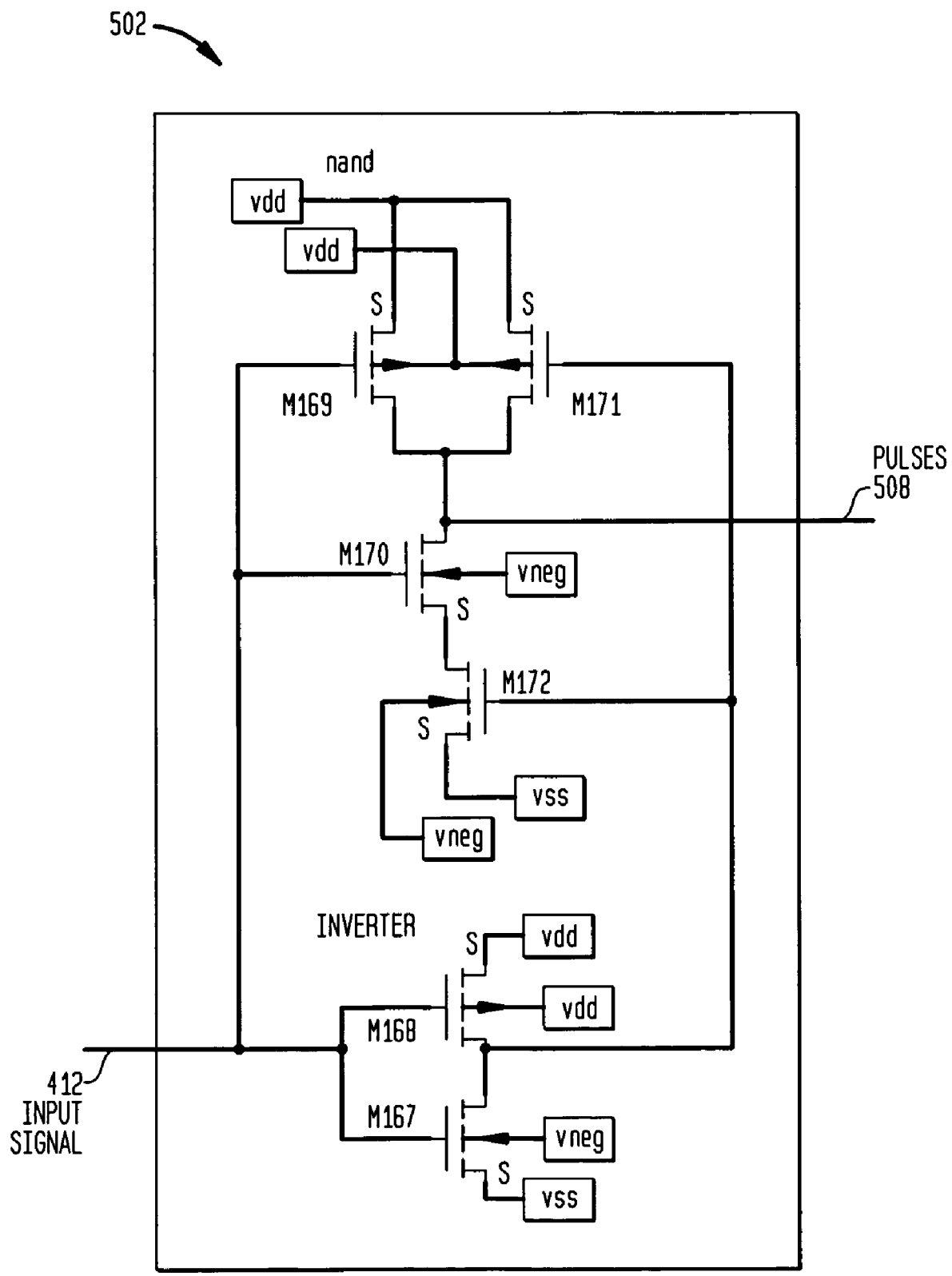
FIG. 6A illustrates an example aperture generator.

An example implementation of the aperture generator 502 is illustrated in FIG. 6A. Additional examples of aperture generation logic are provided in FIGS. 7A and 7B. FIG. 7A illustrates a rising edge pulse generator 702, which generates pulses 508 on rising edges of the input signal 412. FIG. 7B illustrates a falling edge pulse generator 704, which generates pulses 508 on falling edges of the input signal 412.

Figure 6B:
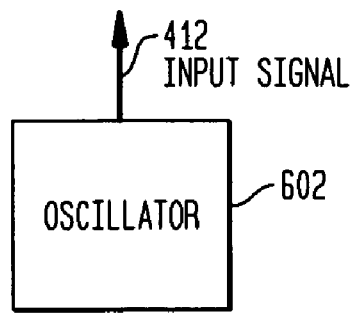
FIG. 6B illustrates an oscillator according to an embodiment of the present invention.

In an embodiment, the input signal 412 is generated externally of the energy transfer signal module 408, as illustrated in FIG. 4. Alternatively, the input signal 412 is generated internally by the energy transfer signal module 408. The input signal 412 can be generated by an oscillator, as illustrated in FIG. 6B by an oscillator 602. The oscillator 602 can be internal to the energy transfer signal module 408 or external to the energy transfer signal module 408. The oscillator 602 can be external to the energy transfer system 401. The output of the oscillator 602 may be any periodic waveform.

The type of down-conversion performed by the energy transfer system 401 depends upon the aliasing rate of the energy transfer signal 406, which is determined by the frequency of the pulses 508. The frequency of the pulses 508 is determined by the frequency of the input signal 412.

The optional energy transfer signal module 408 can be implemented in hardware, software, firmware, or any combination thereof.

Impedance Matching

The energy transfer module 300 described in reference to FIG. 3A, above, has input and output impedances generally defined by (1) the duty cycle of the switch module (i.e., UFT module 302), and (2) the impedance of the storage module (e.g., capacitor 310), at the frequencies of interest (e.g. at the EM input, and intermediate/baseband frequencies).

Starting with an aperture width of approximately ½ the period of the EM signal being down-converted as an example embodiment, this aperture width (e.g. the "closed time") can be decreased (or increased). As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Referring to FIG. 8, a specific example embodiment using an RF signal as an input, assuming that the impedance 812 is a relatively low impedance of approximately 50 Ohms, for example, and the input impedance 816 is approximately 300 Ohms, an initial configuration for the input impedance match module 806 can include an inductor 906 and a capacitor 908, configured as shown in FIG. 9. The configuration of the inductor 906 and the capacitor 908 is a possible configuration when going from a low impedance to a high impedance. Inductor 906 and the capacitor 908 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 914 and an inductor 916 can be configured as shown in FIG. 9. The capacitor 914 and the inductor 916 constitute an L match, the calculation of the component values being well known to those skilled in the relevant arts.

The configuration of the input impedance match module 806 and the output impedance match module 808 are considered to be initial starting points for impedance matching, in accordance with embodiments of the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

Frequency Up-conversion

The present invention is directed to systems and methods of frequency up-conversion, and applications of same.

An example frequency up-conversion system 1000 is illustrated in FIG. 10. The frequency up-conversion system 1000 is now described.

Figure 13A:
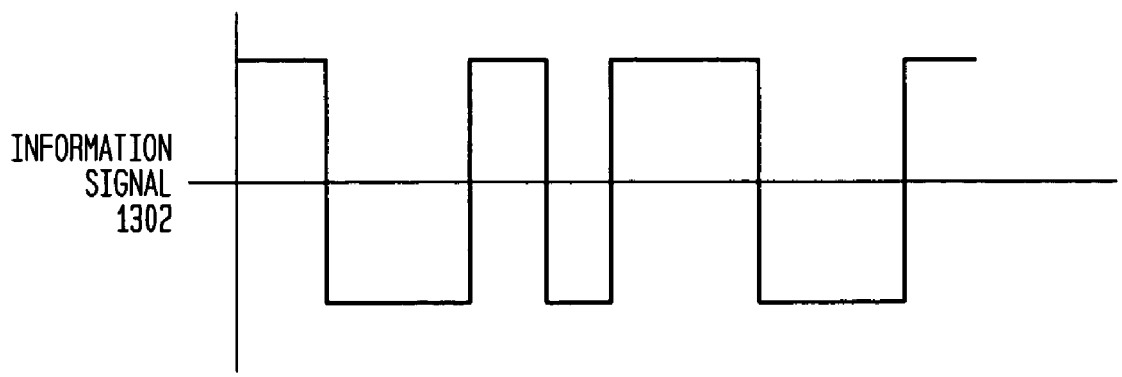
Figure 13B:
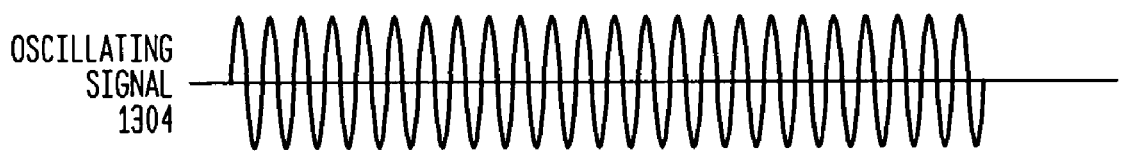
Figure 13C:
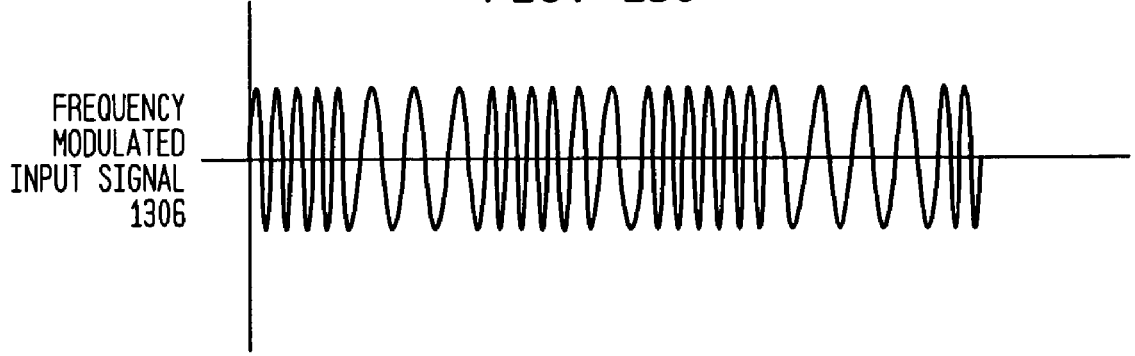

An input signal 1002 (designated as "Control Signal" in FIG. 10) is accepted by a switch module 1004. For purposes of example only, assume that the input signal 1002 is a FM input signal 1306, an example of which is shown in FIG. 13C. FM input signal 1306 may have been generated by modulating information signal 1302 onto oscillating signal 1304 (FIGS. 13A and 13B). It should be understood that the invention is not limited to this embodiment. The information signal 1302 can be analog, digital, or any combination thereof, and any modulation scheme can be used.

Figure 13D:
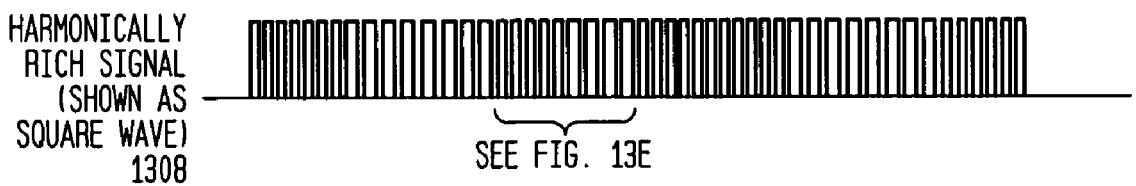

The output of switch module 1004 is a harmonically rich signal 1006, shown for example in FIG. 13D as a harmonically rich signal 1308. The harmonically rich signal 1308 has a continuous and periodic waveform.

Figure 13E:
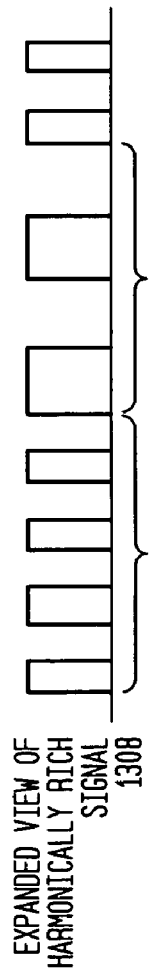

FIG. 13E is an expanded view of two sections of harmonically rich signal 1308, section 1310 and section 1312. The harmonically rich signal 1308 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 13F:
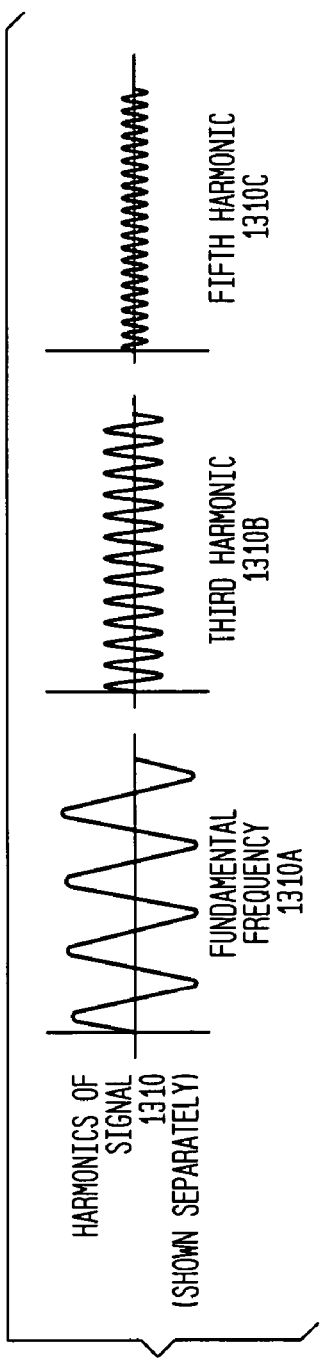
Figure 13G:
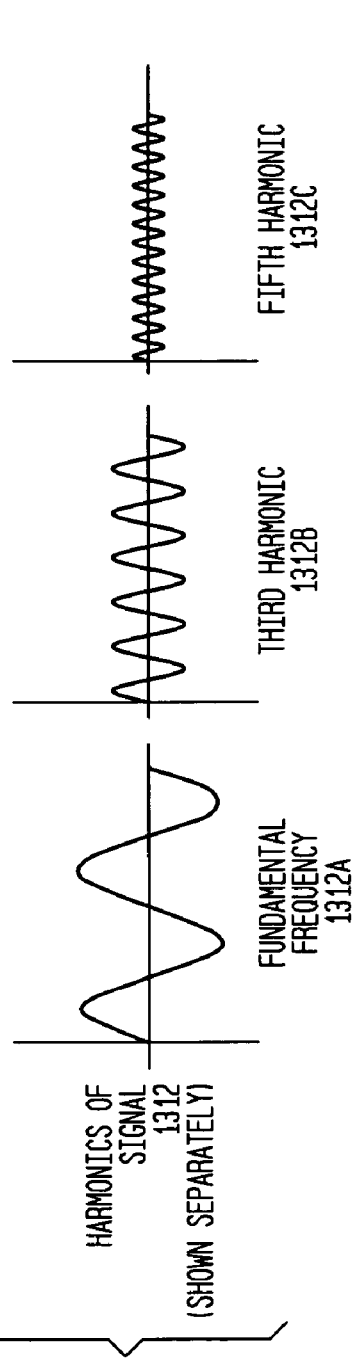
Figure 13H:
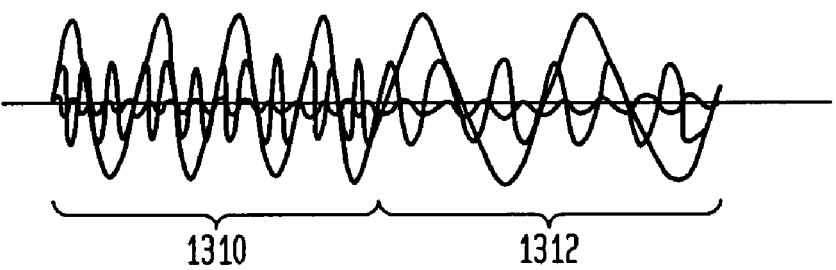

Harmonically rich signal 1308 is comprised of a plurality of sinusoidal waves whose frequencies are integer multiples of the fundamental frequency of the waveform of the harmonically rich signal 1308. These sinusoidal waves are referred to as the harmonics of the underlying waveform, and the fundamental frequency is referred to as the first harmonic. FIG. 13F and FIG. 13G show separately the sinusoidal components making up the first, third, and fifth harmonics of section 1310 and section 1312. (Note that in theory there may be an infinite number of harmonics; in this example, because harmonically rich signal 1308 is shown as a square wave, there are only odd harmonics). Three harmonics are shown simultaneously (but not summed) in FIG. 13H.

The relative amplitudes of the harmonics are generally a function of the relative widths of the pulses of harmonically rich signal 1006 and the period of the fundamental frequency, and can be determined by doing a Fourier analysis of harmonically rich signal 1006. According to an embodiment of the invention, the input signal 1306 may be shaped to ensure that the amplitude of the desired harmonic is sufficient for its intended use (e.g., transmission).

Figure 13I:
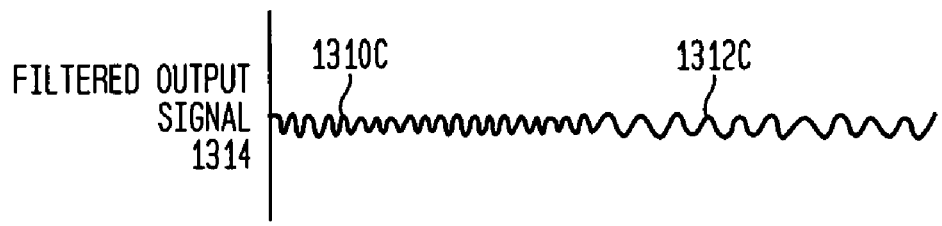

An optional filter 1008 filters out any undesired frequencies (harmonics), and outputs an electromagnetic (EM) signal at the desired harmonic frequency or frequencies as an output signal 1010, shown for example as a filtered output signal 1314 in FIG. 13I.

FIG. 11 illustrates an example universal frequency up-conversion (UFU) module 1101. The UFU module 1101 includes an example switch module 1004, which comprises a bias signal 1102, a resistor or impedance 1104, a universal frequency translator (UFT) 1150, and a ground 1108. The UFT 1150 includes a switch 1106. The input signal 1002 (designated as "Control Signal" in FIG. 11) controls the switch 1106 in the UFT 1150, and causes it to close and open. Harmonically rich signal 1006 is generated at a node 1105 located between the resistor or impedance 1104 and the switch 1106.

Also in FIG. 11, it can be seen that an example optional filter 1008 is comprised of a capacitor 1110 and an inductor 1112 shunted to a ground 1114.

The filter is designed to filter out the undesired harmonics of harmonically rich signal 1006.

The invention is not limited to the UFU embodiment shown in FIG. 11.

For example, in an alternate embodiment shown in FIG. 12, an unshaped input signal 1201 is routed to a pulse shaping module 1202. The pulse shaping module 1202 modifies the unshaped input signal 1201 to generate a (modified) input signal 1002 (designated as the "Control Signal" in FIG. 12). The input signal 1002 is routed to the switch module 1004, which operates in the manner described above. Also, the filter 1008 of FIG. 12 operates in the manner described above.

The purpose of the pulse shaping module 1202 is to define the pulse width of the input signal 1002. Recall that the input signal 1002 controls the opening and closing of the switch 1106 in switch module 1004. During such operation, the pulse width of the input signal 1002 establishes the pulse width of the harmonically rich signal 1006. As stated above, the relative amplitudes of the harmonics of the harmonically rich signal 1006 are a function of at least the pulse width of the harmonically rich signal 1006. As such, the pulse width of the input signal 1002 contributes to setting the relative amplitudes of the harmonics of harmonically rich signal 1006.

Further details of up-conversion as described in this section are presented in U.S. Pat. No. 6,091,940, entitled "Method and System for Frequency Up-Conversion," incorporated herein by reference in its entirety, as well as other applications cited above.

Enhanced Signal Reception

The present invention is directed to systems and methods of enhanced signal reception (ESR), and applications of same, which are described in the above-referenced U.S. Pat. No. 6,061,555, entitled "Method and System for Ensuring Reception of a Communications Signal," incorporated herein by reference in its entirety.

Unified Down-conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

FIG. 14 is a conceptual block diagram of a UDF module 1402 according to an embodiment of the present invention. The UDF module 1402 performs at least frequency translation and frequency selectivity.

The effect achieved by the UDF module 1402 is to perform the frequency selectivity operation prior to the performance of the frequency translation operation. Thus, the UDF module 1402 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1404 received by the UDF module 1402 are at radio frequencies. The UDF module 1402 effectively operates to input filter these RF input signals 1404. Specifically, in these embodiments, the UDF module 1402 effectively performs input, channel select filtering of the RF input signal 1404. Accordingly, the invention achieves high selectivity at high frequencies.

The UDF module 1402 effectively performs various types of filtering, including but not limited to bandpass filtering, low pass filtering, high pass filtering, notch filtering, all pass filtering, band stop filtering, etc., and combinations thereof.

Conceptually, the UDF module 1402 includes a frequency translator 1408. The frequency translator 1408 conceptually represents that portion of the UDF module 1402 that performs frequency translation (down conversion).

The UDF module 1402 also conceptually includes an apparent input filter 1406 (also sometimes called an input filtering emulator). Conceptually, the apparent input filter 1406 represents that portion of the UDF module 1402 that performs input filtering.

In practice, the input filtering operation performed by the UDF module 1402 is integrated with the frequency translation operation. The input filtering operation can be viewed as being performed concurrently with the frequency translation operation. This is a reason why the input filter 1406 is herein referred to as an "apparent" input filter 1406.

The UDF module 1402 of the present invention includes a number of advantages. For example, high selectivity at high frequencies is realizable using the UDF module 1402. This feature of the invention is evident by the high Q factors that are attainable. For example, and without limitation, the UDF module 1402 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1402 can be electrically adjusted, either statically or dynamically.

Also, the UDF module 1402 can be designed to amplify input signals.

Further, the UDF module 1402 can be implemented without large resistors, capacitors, or inductors. Also, the UDF module 1402 does not require that tight tolerances be maintained on the values of its individual components, i.e., its resistors, capacitors, inductors, etc. As a result, the architecture of the UDF module 1402 is friendly to integrated circuit design techniques and processes.

The features and advantages exhibited by the UDF module 1402 are achieved at least in part by adopting a new technological paradigm with respect to frequency selectivity and translation. Specifically, according to the present invention, the UDF module 1402 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and/or samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.) By operating in this manner, the UDF module 1402 preferably performs input filtering and frequency down-conversion in a unified manner.

Further details of unified down-conversion and filtering as described in this section are presented in U.S. Pat. No. 6,049,706, entitled "Integrated Frequency Translation And Selectivity," filed Oct. 21, 1998, and incorporated herein by reference in its entirety.

EXAMPLE EMBODIMENTS OF THE INVENTION

As noted above, the UFT module of the present invention is a very powerful and flexible device. Its flexibility is illustrated, in part, by the wide range of applications and combinations in which it can be used. Its power is illustrated, in part, by the usefulness and performance of such applications and combinations.

Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals. Example receiver and transmitter embodiments implemented using the UFT module of the present invention are set forth below.

Receiver Embodiments

In embodiments, a receiver according to the invention includes an aliasing module for down-conversion that uses a universal frequency translation (UFT) module to down-convert an EM input signal. For example, in embodiments, the receiver includes the aliasing module 300 described above, in reference to FIG. 3A or FIG. 3G. As described in more detail above, the aliasing module 300 may be used to down-convert an EM input signal to an intermediate frequency (IF) signal or a demodulated baseband signal.

In alternate embodiments, the receiver may include the energy transfer system 401, including energy transfer module 404, described above, in reference to FIG. 4. As described in more detail above, the energy transfer system 401 may be used to down-convert an EM signal to an intermediate frequency (IF) signal or a demodulated baseband signal. As also described above, the energy transfer system 401 may include an optional energy transfer signal module 408, which can perform any of a variety of functions or combinations of functions including, but not limited to, generating the energy transfer signal 406 of various aperture widths.

In further embodiments of the present invention, the receiver may include the impedance matching circuits and/or techniques described in herein for optimizing the energy transfer system of the receiver.

In-Phase/Quadrature-Phase (I/Q) Modulation Mode Receiver Embodiments

FIG. 15 illustrates an exemplary I/Q modulation mode embodiment of a receiver 1502, according to an embodiment of the present invention. This I/Q modulation mode embodiment is described herein for purposes of illustration, and not limitation. Alternate I/Q modulation mode embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiver 1502 comprises an I/Q modulation mode receiver 1538, a first optional amplifier 1516, a first optional filter 1518, a second optional amplifier 1520, and a second optional filter 1522.

I/Q modulation mode receiver 1538 comprises an oscillator 1506, a first UFD module 1508, a second UFD module 1510, a first UFT module 1512, a second UFT module 1514, and a phase shifter 1524.

Oscillator 1506 provides an oscillating signal used by both first UFD module 1508 and second UFD module 1510 via the phase shifter 1524. Oscillator 1506 generates an "I" oscillating signal 1526.

"I" oscillating signal 1526 is input to first UFD module 1508. First UFD module 1508 comprises at least one UFT module 1512. First UFD module 1508 frequency down-converts and demodulates received signal 1504 to down-converted "I" signal 1530 according to "I" oscillating signal 1526.

Phase shifter 1524 receives "I" oscillating signal 1526, and outputs "Q" oscillating signal 1528, which is a replica of "I" oscillating signal 1526 shifted preferably by 90 degrees.

Second UFD module 1510 inputs "Q" oscillating signal 1528. Second UFD module 1510 comprises at least one UFT module 1514. Second UFD module 1510 frequency down-converts and demodulates received signal 1504 to down-converted "Q" signal 1532 according to "Q" oscillating signal 1528.

Down-converted "I" signal 1530 is optionally amplified by first optional amplifier 1516 and optionally filtered by first optional filter 1518, and a first information output signal 1534 is output.

Down-converted "Q" signal 1532 is optionally amplified by second optional amplifier 1520 and optionally filtered by second optional filter 1522, and a second information output signal 1536 is output.

In the embodiment depicted in FIG. 15, first information output signal 1534 and second information output signal 1536 comprise a down-converted baseband signal. In embodiments, first information output signal 1534 and second information output signal 1536 are individually received and processed by related system components. Alternatively, first information output signal 1534 and second information output signal 1536 are recombined into a single signal before being received and processed by related system components.

Alternate configurations for I/Q modulation mode receiver 1538 will be apparent to persons skilled in the relevant art(s) from the teachings herein. For instance, an alternate embodiment exists wherein phase shifter 1524 is coupled between received signal 1504 and UFD module 1510, instead of the configuration described above. This and other such I/Q modulation mode receiver embodiments will be apparent to persons skilled in the relevant art(s) based upon the teachings herein, and are within the scope of the present invention.

Other Receiver Embodiments

The receiver embodiments described above are provided for purposes of illustration. These embodiments are not intended to limit the invention.

Alternate embodiments, differing slightly or substantially from those described herein, will be apparent to persons skilled in the relevant art(s) based on the teachings contained herein. Such alternate embodiments include, but are not limited to, down-converting different combinations of modulation techniques in an "I/Q" mode. Other embodiments include those shown in the documents referenced above, including but not limited to U.S. patent application Ser. Nos. 09/525,615 and 09/550,644. Such alternate embodiments fall within the scope and spirit of the present invention.

For example, other receiver embodiments may down-convert signals that have been modulated with other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), down-converting a signal with two forms of modulation embedded thereon, and combinations thereof.

Transmitter Embodiments

The following discussion describes frequency up-converting signals transmitted according to the present invention, using a Universal Frequency Up-conversion Module. Frequency up-conversion of an EM signal is described above, and is more fully described in U.S. Pat. No. 6,091,940 entitled "Method and System for Frequency Up-Conversion," filed Oct. 21, 1998 and issued Jul. 18, 2000, referenced above, as well as in the other documents referenced above (see, for example, U.S. patent application Ser. No. 09/525,615).

Exemplary embodiments of a transmitter according to the invention are described below. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

In embodiments, the transmitter includes a universal frequency up-conversion (UFU) module for frequency up-converting an input signal. For example, in embodiments, the system transmitter includes the UFU module 1000, the UFU module 1101, or the UFU module 1290 as described, above, in reference to FIGS. 10, 11 and 12, respectively. In further embodiments, the UFU module is used to both modulate and up-convert an input signal.

In-Phase/Quadrature-Phase (I/Q) Modulation Mode Transmitter Embodiments

In FIG. 16, an I/Q modulation mode transmitter embodiment is presented. In this embodiment, two information signals are accepted. An in-phase signal ("I") is modulated such that its phase varies as a function of one of the information signals, and a quadrature-phase signal ("Q") is modulated such that its phase varies as a function of the other information signal. The two modulated signals are combined to form an "I/Q" modulated signal and transmitted. In this manner, for instance, two separate information signals could be transmitted in a single signal simultaneously. Other uses for this type of modulation would be apparent to persons skilled in the relevant art(s).

FIG. 16 illustrates an exemplary block diagram of a transmitter 1602 in an I/Q modulation mode. In FIG. 16, a baseband signal comprises two signals, first information signal 1612 and second information signal 1614. Transmitter 1602 comprises an I/Q transmitter 1604 and an optional amplifier 1606. I/Q transmitter 1604 comprises at least one UFT module 1610. I/Q transmitter 1604 provides I/Q modulation to first information signal 1612 and second information signal 1614, outputting I/Q output signal 1616. Optional amplifier 1606 optionally amplifies I/Q output signal 1616, outputting up-converted signal 1618.

FIG. 17 illustrates a more detailed circuit block diagram for I/Q transmitter 1604. I/Q transmitter 1604 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

I/Q transmitter 1604 comprises an oscillator 1706, a phase shifter 1708, a summer 1710, a first switch module 1702, a second switch module 1704, a first phase modulator 1728, and a second phase modulator 1730.

Oscillator 1706 generates an "I"-oscillating signal 1716.

A first information signal 1612 is input to first phase modulator 1728. The "I"-oscillating signal 1716 is modulated by first information signal 1612 in the first phase modulator 1728, thereby producing an "I"-modulated signal 1720.

First switch module 1702 inputs "I"-modulated signal 1720, and generates a harmonically rich "I" signal 1724 with a continuous and periodic wave form.

The phase of "I"-oscillating signal 1716 is shifted by phase shifter 1708 to create "Q"-oscillating signal 1718. Phase shifter 1708 preferably shifts the phase of "I"-oscillating signal 1716 by 90 degrees.

A second information signal 1614 is input to second phase modulator 1730. "Q"-oscillating signal 1718 is modulated by second information signal 1614 in second phase modulator 1730, thereby producing a "Q" modulated signal 1722.

Second switch module 1704 inputs "Q" modulated signal 1722, and generates a harmonically rich "Q" signal 1726, with a continuous and periodic waveform.

Harmonically rich "I" signal 1724 and harmonically rich "Q" signal 1726 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 1724 and harmonically rich "Q" signal 1726 are combined by summer 1710 to create harmonically rich "I/Q" signal 1734. Summers are well known to persons skilled in the relevant art(s).

Optional filter 1732 filters out the undesired harmonic frequencies, and outputs an I/Q output signal 1616 at the desired harmonic frequency or frequencies.

It will be apparent to persons skilled in the relevant art(s) that an alternative embodiment exists wherein the harmonically rich "I" signal 1724 and the harmonically rich "Q" signal 1726 may be filtered before they are summed, and further, another alternative embodiment exists wherein "I"- modulated signal 1720 and "Q"-modulated signal 1722 may be summed to create an "I/Q"-modulated signal before being routed to a switch module. Other "I/Q"-modulation embodiments will be apparent to persons skilled in the relevant art(s) based upon the teachings herein, and are within the scope of the present invention. Further details pertaining to an I/Q modulation mode transmitter are provided in copending U.S. Pat. No. 6,091,940 entitled "Method and System for Frequency Up-Conversion," filed Oct. 21, 1998 and issued Jul. 18, 2000, which is incorporated herein by reference in its entirety.

Other Transmitter Embodiments

The transmitter embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, combinations of modulation techniques in an "I/Q" mode. Such embodiments also include those described in the documents referenced above, such as U.S. patent application Ser. Nos. 09/525,615 and 09/550,644. Such alternate embodiments fall within the scope and spirit of the present invention.

For example, other transmitter embodiments may utilize other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), embedding two forms of modulation onto a signal for up-conversion, etc., and combinations thereof.

Transceiver Embodiments

As discussed above, embodiments of the invention include a transceiver unit, rather than a separate receiver and transmitter. Furthermore, the invention is directed to any of the applications described herein in combination with any of the transceiver embodiments described herein.

An exemplary embodiment of a transceiver system 1800 of the present invention is illustrated in FIG. 18.

Transceiver 1802 frequency down-converts first EM signal 1808 received by antenna 1806, and outputs down-converted baseband signal 1812. Transceiver 1802 comprises at least one UFT module 1804 to perform, at least, frequency down-conversion operations.

Transceiver 1802 inputs baseband signal 1814. Transceiver 1802 frequency up-converts baseband signal 1814. UFT module 1804 performs, at least, frequency up-conversion operations. Accordingly, in some embodiments, UFT module 1804 performs both frequency down-conversion and up-conversion operations. In alternate embodiments, UFT module 1804 only supports frequency down-conversion, and at least one additional UFT module provides for frequency up-conversion. The up-converted signal is output by transceiver 1802, and transmitted by antenna 1806 as second EM signal 1810.

First and second EM signals 1808 and 1810 may be of substantially the same frequency, or of different frequencies. First and second EM signals 1808 and 1810 may have been modulated using the same technique, or may have been modulated by different techniques.

Further example embodiments of receiver/transmitter systems applicable to the present invention may be found in U.S. Pat. No. 6,091,940 entitled "Method and System for Frequency Up-Conversion," incorporated by reference in its entirety.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

Example Embodiment—Real-Time Wireless Exchange of Objects

The invention is directed to a system, method, and computer program product (and combinations and sub-combinations thereof) for enabling on-demand, automatic or semi-automatic, real-time wireless exchange of objects. Preferably, such wireless functionality is achieved using one or more universal frequency translation modules for performing down-conversation and/or up-conversion operations, as described herein.

FIG. 19 illustrates an example scenario 1902 according to an embodiment of the invention. The scenario 1902 includes an interrogator 1904 and a source 1908 that exchange objects 1906. The objects 1906 may comprise content (such as multimedia), functionality (such as software), interface (such as skins), or any other type of information, as will be apparent to persons skilled in the relevant arts.

The interrogator 1904 is an element that requests and receives objects 1906 from sources, such as source 1908. The source 1908 is an element that stores and provides objects 1906 to interrogators, such as interrogator 1904. According to a preferred embodiment of the invention, the exchange of objects 1906 is achieved in a wireless manner that is transparent to the user. Depending on the circumstance, a given element can be either an interrogator, a source, or both. In an embodiment, the interrogator 1904 and the source 1908 each include a wireless access point 1910 and a controller 1912.

Today's mobile world represents a practical and useful application of the invention. For example, the invention can be used in cars which exchange multimedia (music, video, etc.) and other information (maps, hotel and restaurant information, weather information, automobile software, etc.) as they are positioned next to each other at gas stations, or pass each other on the highway. For example, some cars include features that are activated only through installation of software. In an embodiment of the invention, cars exchange such software (in the manner discussed herein), for the purpose of enabling such features.

The invention can be used in PDAs (personal data assistants) which receive menus as their owners walk by restaurants, advertisements as their owners pass by stores, news updates as their owners enter the range of information portals, etc.

It is noted that references to cars, gas stations, PDAs, etc., are made herein solely for illustrative purposes. Such references are not limiting. The invention is applicable to any mobile or stationary object or element having the features and functionality described herein.

In an embodiment, the invention essentially enables ad hoc computer networks, where such networks enable communication and interaction between one or more interrogators and one or more sources. As noted above, depending on the circumstances, a given element can be either an interrogator, a source, or both, and such designations can shift over time for a given element.

The practical feasibility and usefulness of the invention is a function of the specifications and capabilities of the wireless access points 1910 in the interrogators 1904 and sources 1908. In a preferred embodiment, the wireless access points 1910 (as well as the others described herein) are implemented using the receivers, transmitters, and transceivers described elsewhere herein.

The operation of the interrogator 1904 and the source 1908 is represented by a flowchart 2002 shown in FIG. 20. Flowchart 2002 is provided to illustrate an example mode of operation of interrogator 1904 and source 1908, and is not limiting.

In step 2004, a user sets preferences and/or defines a profile, or issues instructions to the interrogator 1904. Such preferences, profile, and/or instructions define the types of objects 1906 that the interrogator 1904 should attempt to locate and download. Such preferences, profile, and/or instructions also define the types of objects 1906 that the user is willing to share, and the degree of sharing allowed (when the interrogator 1904 is operating as a source).

In step 2006, the interrogator 1904 attempts to detect sources within range of interrogator 1904. The range of the interrogator 1904 is a function of the capabilities of the wireless access points 1910 of the interrogator 1904 and potential sources. Assume in this example that the interrogator 1904 detects source 1908.

In step 2008, the interrogator 1904 interrogates the source 1908 pursuant to the user's preferences, profile, and/or instructions (see step 2004 ). Such interrogation may be based on other factors, such as device defaults and compatibilities, existing device content/functionality/interface, etc.

In step 2010, in response to the interrogation of step 208, the source 1908 transmits objects 1906 to the interrogator 1904. The interrogator 1904 receives these objects 1906.

In step 2012, the interrogator 1904 presents the objects 1906 to the user in an implementation dependent manner. Such presentation may be based on a number of factors, such as user preferences/profile, user instructions, device defaults, device content/functionality/interface, etc.

In step 2014, the interrogator 1904 provides objects to devices which request them, such as source 1908. In other words, the steps of flowchart 2002 are repeated, but this time with the roles of the interrogator 1904 and the source 1908 reversed.

The operation of the invention shall be further described with reference to FIG. 21 depicting an example involving a gas station 2110, a car A 2112 and a car B 2114. The gas station 2110 is in communication (wireless or wired) with a content provider 2104, a functionality provider 2106, and an interface provider 2108, and receives objects therefrom. The content provider 2104 is any entity (such as a web site) that provides content. The functionality provider 2106 is any entity that provides functionality, such a computer programs, modules, updates, patches, etc. The interface provider 2108 is any entity that provides interfaces or portions thereof, such as skins.

In an embodiment, the gas station 2110, car A 2112, and car B 2114, each include a controller 2118 and a wireless access point 2120.

Interaction between the gas station 2110 and car A 2112 is shown, for example, in event diagram 2202 of FIG. 22. Such interaction is performed in a wireless manner via the wireless access points 2120A, 2120B. Such interaction is controlled by controllers 2118A, 2118B, which may be represented by hardware state machines or processors operating according to software, or a combination thereof. Such software, when stored in a computer readable medium, is called a computer program product, and forms a part of the invention.

As represented by event 2204, car A 2112 sends a message ("What songs do you have?") to gas station 2110.

In response, the gas station 2110 sends a list of songs to the car A 2112 (event 2206). Car A 2112 processes the list of songs to determine ones that it desires. Such processing may be done by comparing the list of songs 2206 to the preferences and/or profile previously input by car A 2112's user, as well as the songs already stored in car A 2112.

As represented by event 2208, the car A 2112 sends the message "Transmit songs A, B, and C" to gas station 2110.

In response, gas station 2110 sends a message "Provide payment information" to car A 2112 (event 2210). In other words, the gas station 2110 requires that the car A 2112 pay for the requested songs prior to their delivery. It is noted that this payment approach is based on content. That is, the payment amount is based on the content that is being requested. In other embodiments, the payment amount is based on other factors, such as connection time, processing time, the amount being shared by the interrogator, etc., or combinations thereof.

As represented by event 2212, the car A 2112 sends appropriate payment information to the gas station 2110.

In response, gas station 2110 sends requested songs A, B, and C to car A 2112 (event 2214).

As represented by event 2216, car A 2112 sends the message "What skins do you have?" to gas station 2110.

In response, gas station sends a list of skins to car A 2112 (event 2218).

After processing the list of skins 2218, car A 2112 sends a request "Transmit skin D" to gas station 2110 (event 2220).

In response, gas station 2110 sends skin D to car A 2112 (event 2222).

The invention shall be described in greater detail with respect to FIG. 23, which illustrates an example event diagram representing the interaction between car A 2112 and car B 2114 when exchanging objects 1906. FIG. 23 is provided to illustrate an example mode of operation of car A 2112 and car B 2114 (where they have mixed roles as interrogator and source), and is not limiting.

As represented by event 2304, car A 2112 initiates the communication with car B 2114 by sending the message "Are you sharing?" to car B 2114. In response, car B 2114 sends an affirmative reply to car A 2112 as represented by event 2306.

Car A 2112 sends a list of songs and skins to car B 2114, and likewise car B 2114 sends a list of songs and skins to car A 2114 (events 2308 and 2310). Car A 2112 sends a request to transmit song 1 and skin 2 to car B 2114 (event 2312), which results in car B 2114 sending requested song 1 and skin 2 to car A 2112 (event 2314).

Similarly, car B 2114 sends a request to car A 2112 to transmit songs 3 and 4, which results in car A 2112 sending requested songs 3 and 4 to car B 2114 (event 2318).

Further operation of the interrogator 1904 shall now be described with reference to a flowchart 2402 and FIG. 24. For illustrative purposes, flowchart 2402 shall be described from the perspective of car A 2112 when operating in accordance with event diagram 2202 (FIG. 22) or event diagram 2302 (FIG. 23).

In step 2406, car A 2112 determines whether it is in acquire mode. If it is, then step 2408 is performed, where car A 2112 determines whether it has detected a source 1908. If it has, then step 2410 is performed. In the example of FIG.

22, car A 2112 detected the gas station 2110, whereas in the example of FIG. 23, car A 2112 detected car B 2114. It is noted that car A 2112 could have detected these sources at any time when they were in range. For example, car A 2112 could have detected the gas station 2110 when it was being serviced, or when it was driving past on the road, or when it came within proximity of the gas station 2110 (wherein the extent of such proximity is defined by the capabilities of the wireless access points 2120A, 2120B of the gas station 2110 and car A 2112). Car A 2112 could have detected car B 2114 in a similar manner. For purposes of illustration, assume that car A 2112 detected car B 2114 in step 2408.

In step 2410, car A 2112 handshakes with car B 2114. Such handshaking is performed to initiate communication between car A and car B, and its details are implementation dependent.

In step 2412, car A 2112 (operating as the interrogator 1904) interrogates car B 2114 (operating as the source 1908). An example of this is event 2308 in FIG. 23.

In step 2414, car A 2112 receives information from car B 2114. This may be represented by the list of songs sent by car B 2114 to car A 2112 as represented by event 2310 in FIG. 23.

In step 2416, car A 2112 evaluates the information received in step 2414 based on profile, preferences, instructions, local storage, etc. For example, car A 2112 may compare the list of songs transmitted by car B 2114 in step 2414 to the songs already in its memory, and to songs that the user desires (such as jazz) to determine which songs it wishes to request from car B 2114.

In step 2418, car A 2112 requests content, functionality, interface, or other objects 1906 from car B 2114. This is represented, for example, by event 2312 in FIG. 23.

In step 2420, car A 2112 provides payment information to car B 2114, if requested by car B 2114.

In step 2422, car A 2112 receives and stores requested content, functionality, interface, or other objects 1906 received from car B 2114.

FIG. 25 illustrates a flowchart 2502 representing the operation of the source 1908 (also herein referred to as the respondent) according to an embodiment of the invention. With reference to the example scenario 2102 shown in FIG. 21, the source 1908 could be represented by the gas station 2110 or the car B 2114. For purposes of illustration, and not limitation, flowchart 2502 shall be described in the context of the gas station 2110, taking the role of the source 1908.

In step 2506, gas station 2110 detects that car A 2112 wishes to initiate a handshaking process to begin a conversation therebetween.

In step 2508, the gas station 2110 determines whether it is currently sharing objects 1906 with other devices (i.e., is "share mode" enabled?). If not, control returns to step 2506. If share mode is enabled, then step 2510 is processed.

In step 2510, gas station 2110 conducts a handshake procedure with car A 2112 in order to establish a communication session with car A 2112.

In steps 2512 and 2514, gas station 2110 and car A 2112 communicate with one another, whereby car A 2112 requests information and gas station 2110 responds to such requests. This is represented, for example, by events 2208, 2210, 2212, and 2214 shown in FIG. 22.

In step 2516, after gas station 2110 has completed responding to requests of car A 2112, gas station 2110 determines whether or not it is enabled to acquire information from other devices, in this case car A 2112. If it is enabled, then step 2518 is performed.

In steps 2518 and 2520, gas station 2110 and car A 2112 participate in a session similar to that described with respect to step 2512 and step 2514. However, in the case of steps 2518 and 2520, gas station 2110 acts as the interrogator 1904 and car A 2112 acts as the source 1908. Accordingly, as a result of the performance of steps 2518 and 2520, gas station 2110 requests and receives objects 1906 from car A 2112.

Referring again to FIG. 21, note that the invention includes a key chain 2116 that must be in wireless communication with car A 2112, in order for car A 2112 to operate. Such wireless communication is achieved via wireless access points 2120B, 2120D. Other similar security applications of the invention will be apparent to persons skilled in the art.

Flowchart 2602 in FIG. 26 represents the operation of a device, such as gas station 2110, car A 2112, and/or car B 2114, when interacting with a user. For purpose of illustration, and not limitation, flowchart 2602 shall now be described with reference to the operation of car A 2112 when interacting with a user.

In step 2606, car A 2112 interacts with the user to set the user's preferences and/or the user's profile. In other words, the user defines at this point the type of objects 1906 that he wishes to receive, whether or not, and under what circumstances and to what extent, car A 2112 should be in the acquire mode, whether or not, and under what circumstances and to what extent, car A 2112 should be in the share mode, etc. Also, in step 2606 the user defines how car A 2112 should process any objects 1906 received from sources 1908. For example, the user may specify that music files should be immediately added to the local directory and ready for play-back, software and skin files should not be executed without explicit instructions from the user, etc.

At any time, car A 2112 may receive instructions from the user modifying the preferences or profile, initiating acquisition, or changing the share or acquisition mode or level. This is represented by step 2608.

In step 2610, car A 2112 exchanges content, functionality, interface, etc. with other devices (such as gas station 2110, car B 2114, etc.) in the manner discussed above.

In step 2612, car A 2112 provides such content, functionality, interface, to the user in accordance with the preferences, profile, and other user instructions received in steps 1206 and 1208.

OTHER EMBODIMENTS

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for automatically exchanging objects in a wireless mobile environment, comprising:
   (1) initiating communication with a compatible element;
   (2) transmitting a request for objects to said compatible element;
   (3) receiving at least some of said requested objects from said compatible element; and
   (4) processing said received objects;
   wherein said compatible element includes at least one of an interrogator and a source within a wireless communication range of operation;
   wherein step (3) is performed using a frequency down-conversion module comprising a switch, a capacitor coupled to said switch, and a pulse generator coupled to said switch; and
   wherein said pulse generator outputs pulses to said switch, wherein said pulses have apertures and cause said switch to close and sub-sample a carrier signal over said apertures, and wherein energy is transferred from the carrier signal and stored using said capacitor during said apertures of said pulses, and wherein a lower frequency signal is generated from the transferred energy.

2. The method of claim 1, further comprising:
   receiving from a user at least one of user preferences, profile, and instructions.

3. The method of claim 2, further comprising:
   generating said request based on at least one of said user preferences, profile, and instructions.

4. The method of claim 2, wherein step (4) further comprises:
   providing said received objects to said user based on at least one of said user preferences, profile, and instructions.

5. The method of claim 1, wherein said objects comprise at least one of audio files, video files, multimedia files, software, and skins.

6. The method of claim 1, wherein steps (1), (2), (3), and (4) are performed without human involvement.

7. The method of claim 1, further comprising:
   providing payment for said requested objects.

8. The method of claim 1, wherein step (1) comprises:
   verifying that said compatible element has a sharing mode enabled; and
   determining a set of objects said compatible element is sharing.

9. The method of claim 1, further comprising:
   receiving a request for objects from said compatible element; and
   transmitting at least some of said requested objects to said compatible element.

10. The method of claim 9, further comprising:
    receiving at least some of said requested objects from at least one of a content provider, a functionality provider, and an interface provider.

11. The method of claim 1, further comprising:
    communicating with a security device of a user.

12. An apparatus for automatically exchanging objects in a wireless mobile environment, comprising:
    means for identifying a source;
    means for transmitting a request for objects to said source;
    means for receiving at least some of said requested objects from said source; and
    means for processing said received objects;
    wherein said source is within a wireless communication range of operation;
    wherein said receiving means comprises a frequency down-conversion module comprising a switch, a capacitor coupled to said switch, and a pulse generator coupled to said switch; and
    wherein said pulse generator outputs pulses to said switch, wherein said pulses have apertures and cause said switch to close and sub-sample a carrier signal over said apertures, and wherein energy is transferred from the carrier signal and stored using said capacitor during said apertures of said pulses, and wherein a lower frequency signal is generated from the transferred energy.

13. The apparatus of claim 12, further comprising:
    means for receiving from a user of the apparatus at least one of user preferences, profile, and instructions.

14. The apparatus of claim 13, further comprising:
    means for generating said request based on at least one of said user preferences, profile, and instructions, and a local storage of objects.

15. The apparatus of claim 13, wherein said processing means provides said received objects to said user based on at least one of said user preferences, profile, and instructions.

16. The apparatus of claim 12, wherein said objects comprise at least one of audio files, video files, multimedia files, software, and skins.

17. The apparatus of claim 12, further comprising:
    means for providing payment for said requested objects.

18. The apparatus of claim 12, further comprising:
    means for securing the apparatus, wherein a user engages said security means to interact with the apparatus.

19. The apparatus of claim 18, wherein the apparatus includes a first vehicle, and wherein said means for securing the apparatus includes a key chain within a wireless communication range of operation of the first vehicle.

20. The apparatus of claim 12, wherein said identifying means identifies said source based on a wireless communication range of operation of said source.

21. The apparatus of claim 20, further comprising:
    means for receiving a request for objects; and
    means for transmitting at least some of said requested objects.

22. The apparatus of claim 21, further comprising:
    means for receiving at least some of said requested objects from at least one of a content provider, a functionality provider, and an interface provider.

23. The apparatus of claim 12, wherein the apparatus includes a first vehicle.

24. The apparatus of claim 23, wherein said source includes a second vehicle.

25. The apparatus of claim 23, wherein said source includes a service station.

26. The apparatus of claim 12, wherein the apparatus includes a personal data assistant (PDA).

27. The apparatus of claim 26, wherein said source includes at least one of a restaurant, a store, and an information portal.

28. A system for automatically exchanging objects in a wireless mobile environment, comprising:
    a first element having a first wireless access point and a first controller; and
    a second element having a second wireless access point and a second controller, wherein said second wireless access point is capable of transmitting at least one object to said first element;

wherein said first wireless access point is capable of receiving the at least one object from said second element, and wherein said first element provides the at least one object to a user;

wherein said first wireless access point comprises a frequency down-conversion module comprising a switch, a capacitor coupled to said switch, and a pulse generator coupled to said switch; and wherein said pulse generator outputs pulses to said switch, wherein said pulses have apertures and cause said switch to close and sub-sample a carrier signal over said apertures, and wherein energy is transferred from the carrier signal and stored using said capacitor during said apertures of said pulses, and wherein a lower frequency signal is generated from the transferred energy.

29. The system of claim 28, wherein said first wireless access point is capable of transmitting the at least one object to said second element, and wherein said second wireless access point is capable of receiving the at least one object from said first element.

30. The system of claim 28, wherein said first and second wireless access points include at least one of a receiver, a transmitter, and a transceiver.

31. The system of claim 28, wherein said first and second controllers include at least one of a hardware state machine and a processor operating according to software.

32. The system of claim 28, wherein said second wireless access point is within a wireless communication range of operation of said first wireless access point.

33. The system of claim 28, wherein the at least one object includes at least one of audio files, video files, multimedia files, software, and skins.

34. The system of claim 28, further comprising:
a security device having a third wireless access point and a third controller, wherein the user interacts with said security device to control access to said first element.

35. The system of claim 28, further comprising:
at least one of a content provider, a functionality provider, and an interface provider, wherein said second device is capable of receiving the at least one object from said at least one content provider, functionality provider, and interface provider.

36. The system of claim 28, wherein said first element receives from the user at least one of user preferences, profile, and instructions.

37. The system of claim 28, wherein said first element includes a first vehicle.

38. The system of claim 37, wherein said second element includes a second vehicle within a wireless communication range of operation of said first vehicle.

39. The system of claim 37, wherein said second element includes a service station within a wireless communication range of operation of said first vehicle.

40. A method for a first vehicle to automatically exchange objects with a second vehicle in a wireless mobile environment, comprising:
(1) approaching the second vehicle;
(2) initiating communication with the second vehicle, wherein the second vehicle is within a wireless communication range of the first vehicle;
(3) transmitting a request for objects to the second vehicle;
(4) receiving at least some of the requested objects from the second vehicle; and
(5) processing the received objects;

wherein step (4) is performed using a frequency down-conversion module comprising a switch, a capacitor coupled to said switch, and a pulse generator coupled to said switch; and wherein said pulse generator outputs pulses to said switch, wherein said pulses have apertures and cause said switch to close and sub-sample a carrier signal over said apertures, and wherein energy is transferred from the carrier signal and stored using said capacitor during said apertures of said pulses, and wherein a lower frequency signal is generated from the transferred energy.

41. The method of claim 40, further comprising:
performing steps (2)–(5) without human involvement.

42. The method of claim 40, wherein step (3) comprises:
transmitting a request to the second vehicle for at least one of audio files, video files, multimedia files, software, and skins.

43. The method of claim 40, further comprising:
receiving a request for objects from the second vehicle; and
transmitting at least some of the requested objects to the second vehicle.

44. The method of claim 40, further comprising:
receiving a request for payment information from the second vehicle for the requested objects; and
providing the payment information to the second vehicle.

45. The method of claim 40, further comprising:
receiving at least one of user preferences, user profile, and instructions from a user of the first vehicle.

46. The method of claim 45, further comprising:
providing the received objects to the user of the first vehicle.

47. The method of claim 45, further comprising:
communicating with a security device of the user of the first vehicle.

48. A method for automatically exchanging objects between a vehicle and a service station in a wireless mobile environment, comprising:
(1) approaching the service station;
(2) initiating communication with the service station, wherein the service station is within a wireless communication range of the vehicle;
(3) transmitting a request for objects to the service station;
(4) receiving at least some of the requested objects from the service station; and
(5) processing the received objects;

wherein step (4) is performed using a frequency down-conversion module comprising a switch, a capacitor coupled to said switch, and a pulse generator coupled to said switch; and wherein said pulse generator outputs pulses to said switch, wherein said pulses have apertures and cause said switch to close and sub-sample a carrier signal over said apertures, and wherein energy is transferred from the carrier signal and stored using said capacitor during said apertures of said pulses, and wherein a lower frequency signal is generated from the transferred energy.

49. The method of claim 48, further comprising:
performing steps (2)–(5) without human involvement.

50. The method of claim 48, wherein step (3) comprises:
transmitting a request to the service station for at least one of audio files, video files, multimedia files, software, and skins.

51. The method of claim 48, further comprising:

receiving a request for objects from the service station; and transmitting at least some of the requested objects to the service station.

52. The method of claim 48, further comprising:

receiving a request for payment information from the service station for the requested objects; and providing the payment information to the service station.

53. The method of claim 48, further comprising:

receiving at least one of user preferences, user profile, and instructions from a user of the first vehicle.

54. The method of claim 53, further comprising:

providing the received objects to the user of the first vehicle.

55. The method of claim 53, further comprising:

communicating with a security device of the user of the first vehicle.

* * * * *